(12) United States Patent
Mitsuhashi et al.

(10) Patent No.: US 12,100,790 B2
(45) Date of Patent: Sep. 24, 2024

(54) METHOD OF MANUFACTURING LIGHT EMITTING DEVICE

(71) Applicant: NICHIA CORPORATION, Anan (JP)

(72) Inventors: Shinya Mitsuhashi, Tokushima (JP); Takuhiro Furukawa, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 176 days.

(21) Appl. No.: 17/874,787

(22) Filed: Jul. 27, 2022

(65) Prior Publication Data

US 2023/0037204 A1     Feb. 2, 2023

(30) Foreign Application Priority Data

Jul. 30, 2021   (JP) .................. 2021-125207

(51) Int. Cl.
*H01L 33/56*     (2010.01)
*F21V 8/00*      (2006.01)
(Continued)

(52) U.S. Cl.
CPC ............ *H01L 33/56* (2013.01); *G02B 6/0073* (2013.01); *H01L 21/6715* (2013.01);
(Continued)

(58) Field of Classification Search
CPC ..... H01L 33/56; H01L 33/62; H01L 21/6715; H01L 25/0753; H01L 25/13; G02B 6/0073; G02B 6/0021
See application file for complete search history.

(56) References Cited

U.S. PATENT DOCUMENTS

2003/0227095 A1   12/2003   Fujisawa et al.
2005/0067717 A1   3/2005    Shizuno
(Continued)

FOREIGN PATENT DOCUMENTS

JP   H01-134938 A   5/1989
JP   2001-028376 A   1/2001
(Continued)

OTHER PUBLICATIONS

Lv et al., CN 114093902, Feb. 2022 (Year: 2022).*
(Continued)

*Primary Examiner* — Mary Ellen Bowman
(74) *Attorney, Agent, or Firm* — Foley & Lardner LLP

(57) ABSTRACT

A method of manufacturing a light emitting device includes: a resin layer disposition step including disposing, on a support, a resin layer in an A-stage state; a light emitting element mounting step including mounting a light emitting element on the resin layer such that a first surface faces an upper surface of the resin layer; a load application step including applying a load to the light emitting element so as to embed the semiconductor stack structure at least partly in the resin layer while a second surface of the light emitting element is exposed from the resin layer; a first heating step including heating the resin layer at a first temperature without applying the load, to lower a viscosity of the resin layer; and a second heating step including heating the resin layer at a second temperature higher than the first temperature to harden the resin layer.

13 Claims, 13 Drawing Sheets

(51) Int. Cl.
*H01L 21/67* (2006.01)
*H01L 25/075* (2006.01)
*H01L 25/13* (2006.01)
*H01L 33/62* (2010.01)

(52) U.S. Cl.
CPC .......... *H01L 25/0753* (2013.01); *H01L 25/13* (2013.01); *H01L 33/62* (2013.01); *G02B 6/0021* (2013.01); *G02B 6/0068* (2013.01); *H01L 2933/005* (2013.01)

(56) References Cited

U.S. PATENT DOCUMENTS

| | | |
|---|---|---|
| 2006/0008944 A1 | 1/2006 | Shizuno |
| 2006/0275952 A1 | 12/2006 | Gowda et al. |
| 2013/0157419 A1 | 6/2013 | Shimizu et al. |
| 2014/0024153 A1 | 1/2014 | Mitani et al. |
| 2014/0024179 A1 | 1/2014 | Mitani et al. |
| 2014/0091348 A1 | 4/2014 | Katayama et al. |
| 2014/0220714 A1 | 8/2014 | Sorimachi |
| 2015/0179482 A1* | 6/2015 | Mitani ................ H01L 23/293 438/118 |
| 2015/0194324 A1 | 7/2015 | Mitani et al. |
| 2018/0239193 A1 | 8/2018 | Hayashi |
| 2018/0287020 A1 | 10/2018 | Kim et al. |
| 2021/0080786 A1 | 3/2021 | Hayashi |
| 2022/0069177 A1* | 3/2022 | Yamada ................ H01L 33/505 |
| 2023/0037204 A1 | 2/2023 | Mitsuhashi et al. |

FOREIGN PATENT DOCUMENTS

| | | |
|---|---|---|
| JP | 2004-152983 A | 5/2004 |
| JP | 2004-288771 A | 10/2004 |
| JP | 2005-108898 A | 4/2005 |
| JP | 2008-060608 A | 3/2008 |
| JP | 2008-543109 A | 11/2008 |
| JP | 2012-169501 A | 9/2012 |
| JP | 2013-128060 A | 6/2013 |
| JP | 2014-075450 A | 4/2014 |
| JP | 2015-213201 A | 11/2015 |
| JP | 2016-076694 A | 5/2016 |
| JP | 2017-228657 A | 12/2017 |
| JP | 2018-133304 A | 8/2018 |
| WO | WO-2013/005646 A1 | 1/2013 |
| WO | WO-2014/014008 A1 | 1/2014 |

OTHER PUBLICATIONS

Doi et al., JP 2008/060608, Mar. 2008 (Year: 2008).*
Kanamaru et al., JP 2012/169501, Sep. 2012 (Year: 2012).*
Sorimachi, WO 2013/005646, Jan. 2013 (Year: 2013).*
Non-Final Office Action in U.S. Appl. No. 17/544,129 dated Mar. 25, 2024.

* cited by examiner

Fig. 6D1

Fig. 6D2
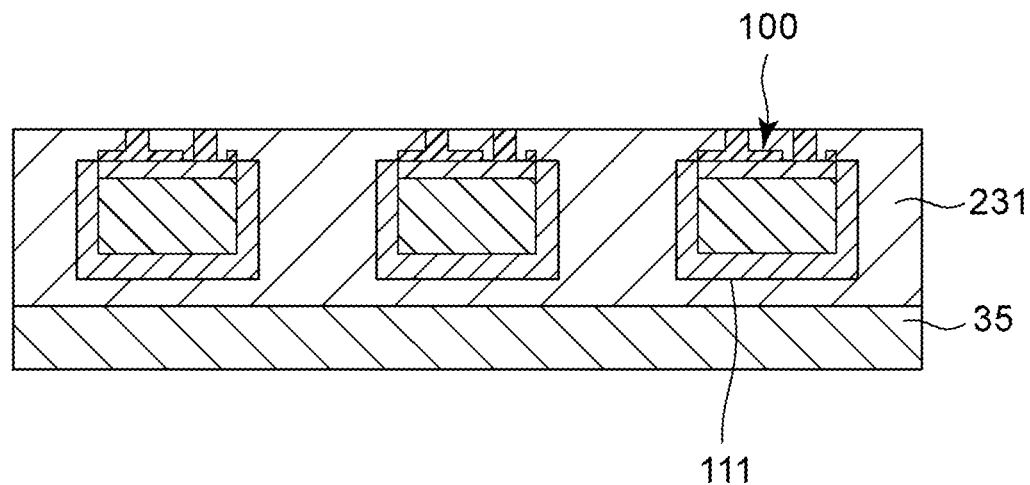
Fig. 6E
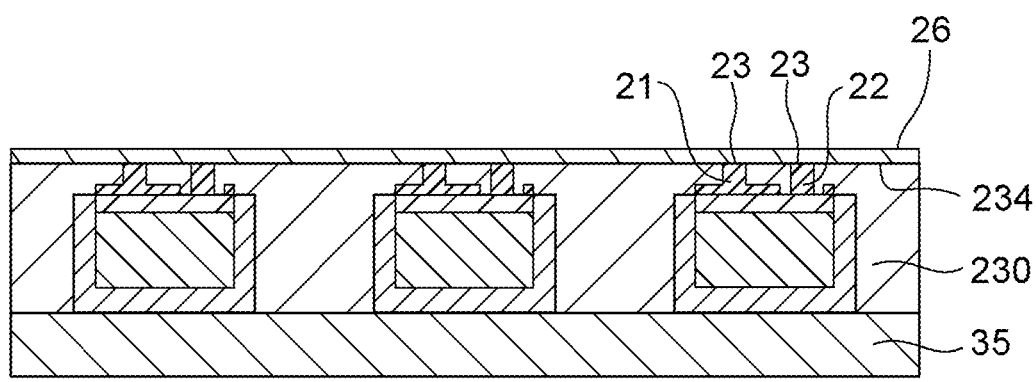

METHOD OF MANUFACTURING LIGHT EMITTING DEVICE

CROSS REFERENCE TO RELATED APPLICATION

This application claims priority to Japanese Patent Application No. 2021-125207, filed on Jul. 30, 2021, the entire contents of which are hereby incorporated by reference.

BACKGROUND

The present disclosure relates to a method of manufacturing a light emitting device.

Light emitting devices having light emitting elements have been known. See, for example, Japanese Patent Publication No. 2017-228657.

SUMMARY

With expansion of applications of light emitting devices that include light emitting elements, there is a demand for providing inexpensive light emitting devices.

According to one embodiment of the present disclosure, a method is provided for manufacturing a light emitting device that includes a light emitting element, the light emitting element including a semiconductor stack structure having a first surface, a second surface opposite to the first surface, and lateral surfaces between the first surface and the second surface, and electrodes disposed on the second surface of the semiconductor stack structure, the lateral surfaces of the semiconductor stack structure being covered by a resin member. The method includes: a resin layer disposition step including disposing on a support a resin layer in its A-stage state; a light emitting element mounting step including mounting a light emitting element on the resin layer such that the first surface faces the upper surface of the resin layer; a load application step including applying a load to the light emitting element so as to embed the semiconductor stack structure at least partly in the resin layer while exposing the second surface from the resin layer; a first heating step including heating the resin layer at a first temperature without applying the load to the light emitting element to lower the viscosity of the resin layer; and a second heating step including heating the resin layer at a second temperature higher than the first temperature to harden in the state in which the second surface is exposed from the resin layer to form a resin member.

According to the method described above, light emitting devices can be inexpensively manufactured.

BRIEF DESCRIPTION OF THE DRAWINGS

FIG. 6D1 is a schematic cross-sectional view illustrating a light emitting device manufacturing step according to the third embodiment.

FIG. 6D2 is a schematic cross-sectional view illustrating a light emitting device manufacturing step according to the third embodiment.

FIG. 6E is a schematic cross-sectional view illustrating a light emitting device manufacturing step according to the third embodiment.

DETAILED DESCRIPTION

Figure 1A:
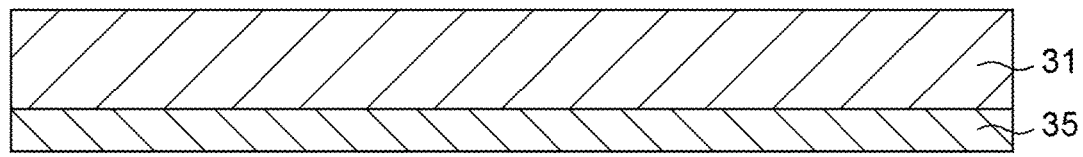
FIG. 1A is a schematic cross-sectional view illustrating a light emitting device manufacturing step according to a first embodiment.

Certain embodiments of the invention in the present disclosure will be explained below with reference to the accompanying drawings. The methods of manufacturing light emitting devices described below are provided to give shape to the technical ideas of the present invention, and do not limit the present invention to those described below unless otherwise specifically stated. In the drawings, the same reference numerals may be used to denote the members having the same functions. For description of the gist of the invention and ease of understanding, description of configurations may be given in a plurality of embodiments, but configurations in different embodiments can be partially substituted for or combined with each other. The description of features that is given in an embodiment and is the same with that in a subsequent embodiment will be omitted in the description of the subsequent embodiment, and only configurations different from the embodiment will be described in the subsequent embodiment. In particular, similar functions and effects of similar configurations will not be repeatedly described among embodiments. The sizes of and relative positions of the members shown in the drawings might be exaggerated for clarity of explanation. An end view showing only a cut section might be used as a cross-sectional view.

First Embodiment

A method of manufacturing a light emitting device according to a first embodiment of the present disclosure will be explained with reference to FIG. 1A to FIG. 1F. The method of manufacturing a light emitting device according to the first embodiment of the present disclosure is a method of manufacturing a light emitting device 100 that includes (i) a light emitting element 1 including a semiconductor stack structure 10 having a first surface 11 serving as, for example, an emission surface, a second surface 12 opposite to the first surface 11, and lateral surfaces 13 between the first surface 11 and the second surface 12 and including a substrate 15 and a semiconductor layer 16, and electrodes 20 including a first electrode 21 and a second electrode 22 disposed on the second surface 12 of the semiconductor stack structure 10, and (ii) a resin member 30 covering at least the lateral surfaces 13 of the semiconductor stack structure 10.

The method of manufacturing a light emitting device according to one embodiment of the present disclosure includes:

(a) a resin layer disposition step that includes disposing on a support 35 a resin layer 31 in its A-stage state, (b) a light emitting element mounting step that includes mounting a light emitting element 1 on the upper surface of the resin layer 31 such that the first surface 11 of the semiconductor stack structure 10 of the light emitting element 1 faces the upper surface of the resin layer 31 in its A-stage state disposed on the support 35, (c) a load application step that includes applying a load to the light emitting element 1 so as to embed the semiconductor stack structure 10 at least partly in the resin layer 31 while exposing the second surface 12 from the resin layer 31, (d) a first heating step that includes heating the resin layer 31 at a first temperature without applying the load to the light emitting element 1 to lower the viscosity of the resin layer 31, and (e) a second heating step that includes heating the resin layer 31 at a second temperature higher than the first temperature to harden in the state in which the second surface 12 is exposed from the resin layer 31 to thereby form a resin member 30.

These steps will be explained in detail below.

(a) Resin Layer Disposition Step

As shown in FIG. 1A, a resin layer 31 in its A-stage state is disposed on a support 35. A resin layer 31 in its A-stage state can be disposed on a support 35, for example, by adhering to the support 35 a resin sheet in its A-stage state that has been prepared in advance. A vacuum laminator, for example, can be used to adhere the resin sheet. Specifically, after achieving predetermined vacuum quality, the resin is pressed by using a diaphragm. Disposition of a resin layer 31 in this step is not limited to adhering with a resin sheet. For example, a resin layer 31 in its A-stage state may be disposed by coating a support 35 with an uncured resin. For the technique of disposing a resin layer 31, for example, roll coating, spraying, compression forming, or the like can be used.

As used herein, the term "A-stage state" refers to the uncured state. The uncured state refers to the state before curing reactions progress, i.e., the state before executing an operation that allows curing reactions to progress. Examples of operations that allow curing reactions to progress include heating, light irradiation, and the like. Curing reactions can progress to a slight extent before executing an operation that allows curing reactions to progress, and such a state is encompassed by the uncured state. Furthermore, an A-stage state is not a liquid state, but is a non-fluidal state. For example, coating a support with a resin material containing a solvent, such as cyclohexane, and subsequently evaporating most of the solvent allows the resin to be in its non-fluidal state, and this state is defined as its A-stage state.

For the resin to be used for the resin layer 31, a thermosetting resin, such as a silicone resin, epoxy resin, or acrylic resin can be used.

The resin layer 31 may have any appropriate thickness, i.e., may have a thickness larger or smaller than, or the same as, the thickness t (the distance between the first surface 11 and the second surface 12) of the semiconductor stack structure 10 of the light emitting element 1. The thickness of the resin layer 31 is preferably larger than the thickness t of the semiconductor stack structure 10 of the light emitting element 1. In the case in which the thickness of the resin layer 31 is smaller than the thickness t of the semiconductor stack structure 10 of the light emitting element 1, utilizing the ability of the resin to wet and spread onto the lateral surfaces 13 in the first heating step described later allows the resin layer 31 to fully cover the lateral surfaces 13 of the semiconductor stack structure 10 of the light emitting element 1.

(b) Light Emitting Element Mounting Step

Figure 1B:
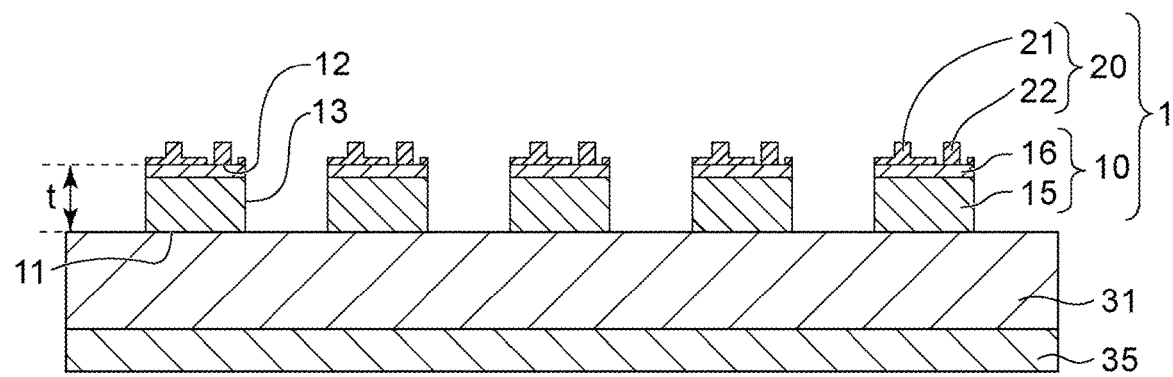
FIG. 1B is a schematic cross-sectional view illustrating a light emitting device manufacturing step according to the first embodiment.

As shown in FIG. 1B, with the resin layer 31 disposed on the support 35 maintained to be in its A-stage state, the light emitting elements 1 are mounted on the upper surface of the resin layer 31 such that the first surfaces 11 of the semiconductor stack structures 10 of the light emitting elements 1 face the upper surface of the resin layer 31. The light emitting elements 1 are arranged at predetermined intervals in accordance with the size of the light emitting devices 100 to be obtained. Specifically, the light emitting elements 1 are arranged at predetermined intervals, for example, in a matrix, in consideration of the thickness of the resin member 30 to cover the lateral surfaces 13 of the semiconductor stack structures 10 of the light emitting elements 1.

Any appropriate technique may be employed for mounting the light emitting elements 1 on the resin layer 31. The light emitting elements 1 can be mounted individually in sequence, or a plurality of light emitting elements 1 can be mounted collectively. In the case of collectively mounting a plurality of light emitting elements 1, for example, separately from the support on which the resin layer 31 is disposed described above, another support having a photosensitive adhesive layer (hereinafter may be referred to as a second support) on which a plurality of light emitting elements are mounted via the photosensitive adhesive layer is provided. A typical example of the second support is a UV sheet in which a UV curable adhesive layer is disposed on a resin base. Then UV light is irradiated on the second support to lower the tackiness of the adhesive. In this manner, the adhesion between the adhesive layer and the light emitting elements 1 is made weaker than the adhesion between the light emitting elements 1 and the resin layer 31. Then the light emitting elements 1 arranged on the second support are collectively mounted on the resin layer 31. Due to the difference in adhesion, the light emitting elements 1 are more strongly adhered to the resin layer 31 than to the second support. Then the second support is detached from the light emitting elements. In this manner, the light emitting elements 1 can be collectively transferred to the upper surface of the resin layer 31. The second support can be detached from the light emitting elements at any appropriate time, and may be detached, for example, after the load application step, the first heating step, or the second heating step.

The semiconductor stack structure 10 of the light emitting element 1 includes, for example, a sapphire or gallium nitride substrate 15 and a semiconductor layer 16 disposed on the substrate 15. The semiconductor layer 16 includes a n-type semiconductor layer, a p-type semiconductor layer, and an emission layer disposed between these layers. The light emitting element 1 further includes a first electrode 21 electrically connected to the n-type semiconductor layer, and a second electrode 22 electrically connected to the p-type semiconductor layer. The semiconductor stack structure 10 does not necessarily include a substrate. The emission layer may have a structure having a single active layer, or a structure having a group of active layers. The semiconductor stack structure 10, for example, may have a double heterostructure, single quantum well structure (SQW), or a multi quantum well structure (MQW). The emission layer is adapted to emit visible light or ultraviolet light. The emission layer is adapted to emit visible light in a range of blue to red light. Examples of the semiconductor stack structure 10 that includes such an emission layer include $In_xAl_yGa_{1-x-y}N$ ($0≤x$, $0≤y$, $x+y≤1$).

The semiconductor stack structure 10 can include at least one emission layer configured to emit the light described above. For example, the semiconductor stack structure 10 may have a structure that includes one or more emission layers between an n-type semiconductor layer and a p-type semiconductor layer, or a structure in which an n-type semiconductor layer, an emission layer, and a p-type semiconductor layer, which are layered in sequence, are repeated a plurality of times. In the case in which the semiconductor stack structure 10 includes a plurality of emission layers, the emission layers may include emission layers adapted to emit light of different peak emission wavelengths or the same peak emission wavelength. The same peak emission wavelength may include variations of about several nanometers, for example. Such a combination of peak emission wavelengths may be appropriately selected. In the case in which the semiconductor stack structure 10 includes two emission layers, for example, the emission layers can be selected in combinations of blue light and blue light, green light and green light, red light and red light, ultraviolet light and ultraviolet light, blue light and green light, blue light and red light, green light and red light, and the like. The emission layer may include a plurality of active layers emitting light of different peak emission wavelengths, or a plurality of active layers emitting light of the same peak emission wavelength.

(c) Load Application Step

Figure 1C:
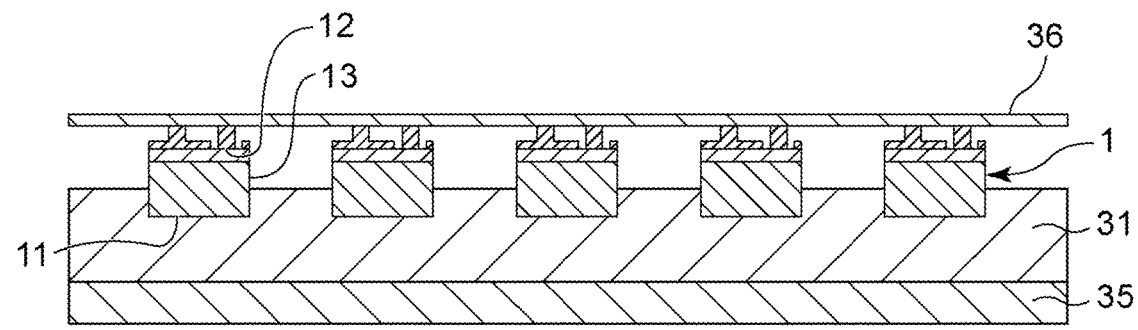
FIG. 1C is a schematic cross-sectional view illustrating a light emitting device manufacturing step according to the first embodiment.

As shown in FIG. 1C, a downward load (downward direction in the drawing) is applied to the light emitting elements 1 using a plate 36 to push the semiconductor stack structures 10 of the light emitting elements 1 at least partly into the resin layer 31. Accordingly, at least portions of the semiconductor stack structures 10 are embedded in the resin layer 31 in the state in which the second surfaces 12 of the semiconductor stack structures 10 are exposed from the resin layer 31. While the electrodes 20 are present on the second surfaces 12 in FIG. 1C, the term "expose" as used herein indicates a state in which the second surfaces are exposed from the resin layer 31, i.e., not covered by the resin layer 31, and may include a state of being covered by the electrodes 20.

Figure 2A:
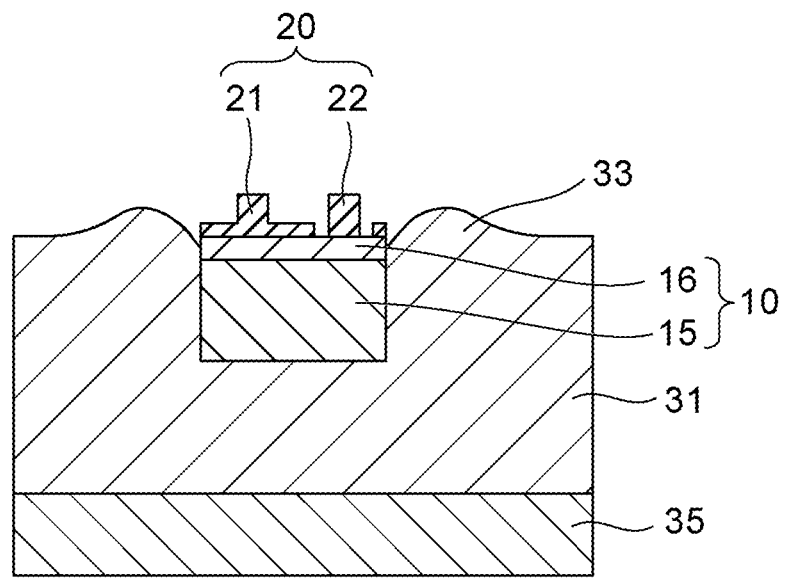
FIG. 2A a schematic cross-sectional view of a state in which a light emitting device is embedded in a load application step.
Figure 2B:
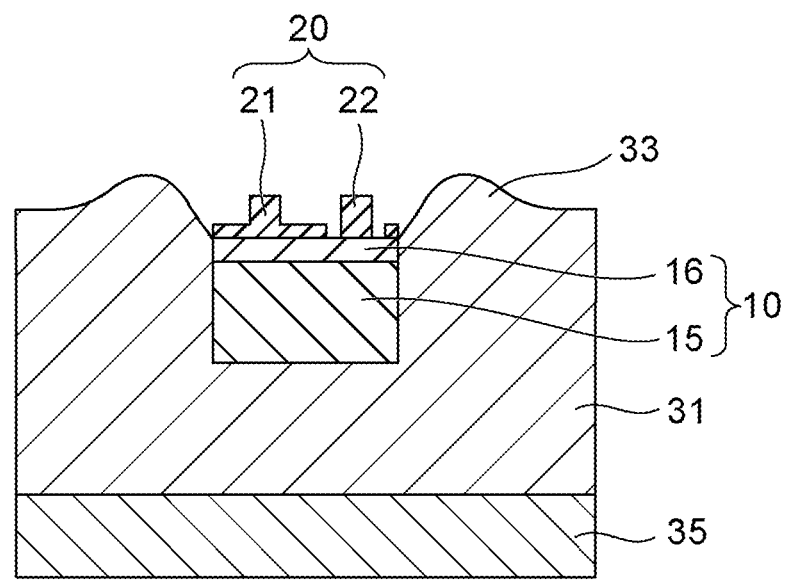
FIG. 2B a schematic cross-sectional view of a state in which a light emitting device is embedded in a load application step.

In the load application step, pushing the light emitting elements 1 partly into the resin layer 31 can achieve proper positioning of the light emitting elements, which allows for preventing misalignments. FIG. 2A and FIG. 2B each show a light emitting element in an embedded state. As shown in each drawing, pushing the light emitting element 1 into the resin layer 31 creates a raised portion 33 in the resin layer 31 around the light emitting element 1.

In one aspect, as shown in FIG. 2A, the light emitting element 1 is embedded such that the semiconductor stack structure 10 is partly embedded in the resin layer 31, and the second surface 12 is exposed from the resin layer 31. In other words, the light emitting element 1 is embedded in the resin layer 31 such that a portion of each of the lateral surfaces 13 and the second surface 12 of the semiconductor stack structure 10 are exposed from the resin layer 31. In this form, when the semiconductor stack structure 10 includes a substrate 15 and a semiconductor layer 16 disposed on the substrate 15, the pushing depth can be set such that at least the lateral surfaces of the substrate 15 are partly covered, preferably the lateral surfaces of the substrate 15 are entirely covered, and the lateral surfaces of the semiconductor layer 16 are partly covered. Setting the pushing depth to allow the resin to entirely cover the lateral surfaces of the substrate 15 and partly cover the lateral surfaces of the semiconductor layer 16 can more effectively prevent the light emitting element 1 from becoming misaligned or oblique to the vertical direction, which allows for improving the mounting accuracy.

In another aspect, as shown in FIG. 2B, the light emitting element 1 is embedded in the resin layer 31 such that the semiconductor stack structure 10 are entirely embedded and the second surface 12 is exposed from the resin layer 31. In other words, the light emitting element 1 is embedded such that the lateral surfaces 13 of the semiconductor stack structure 10 are entirely covered by the resin layer 31 and the second surface 12 is exposed from the resin layer 31. In this form, the pushing depth may be greater than the thickness of the semiconductor stack structure 10. For example, the second surface 12 once pushed into the resin may be positioned lower than the upper surface of the resin layer 31 prior to pushing the light emitting element.

Any appropriate technique may be employed for applying a load as long as it can push the light emitting element 1 into the resin layer 31. For example, a downward load can be applied to the light emitting element 1 by using, for example, a press, vacuum laminator (e.g., diaphragm type laminator), or the like.

The direction in which the load is applied, for example, forms an angle of 20 degree or less, preferably 10 degree or less, more preferably 5 degree or less with the direction perpendicular to principal surface of the resin layer 31. Most preferably, the direction is perpendicular to the principal surface of the resin layer 31. Furthermore, a load may be applied to a plurality of light emitting elements in different directions. For example, a load may be applied to a certain light emitting element in the direction perpendicular to the principal surface of the resin layer 31, and to the surrounding light emitting elements in a direction that forms an angle of a few degree with respect to the perpendicular direction.

By using a plate 36 in the load application step, a downward load can be applied to a plurality of light emitting elements at the same time. This can also prevent the light emitting elements from becoming oblique to the vertical direction. In this step, the plate 36 is not necessarily used.

The plate 36 preferably is hard enough so as not to deform when a load is applied during pushing. Any appropriate material may be used for the plate 36. A resin, metal, or glass can be used, preferably a highly rigid metal such as stainless steel is used. Examples of resins include polyethylene terephthalate, polypropylene, polyethylene, or polyvinyl chloride, and the like.

For the plate 36, the second support described above may be used. For example, the light emitting elements 1 are mounted on the second support via a photosensitive adhesive such that the electrodes 20 face the second support. After placing the second support having the light emitting elements 1 on the resin 31 such that the first surfaces 11 of the semiconductor stack structure 10 of the light emitting elements 1 face the upper surface of the resin 31, a load can be applied to the light emitting elements 1 via the second support.

It is sufficient that the applied load allows for pushing the light emitting elements 1 into the resin layer 31, and is appropriately set in accordance with the type of resin. For example, in the case in which the resin layer 31 includes a thermosetting silicone resin, epoxy resin, or acrylic resin, the load can be in a range of 100 kN/m$^2$ to 3000 kN/m$^2$, preferably in a range of 1000 kN/m$^2$ to 1500 kN/m$^2$.

It is sufficient that the light emitting elements are pushed by a pushing depth that allows for at least partly embed the semiconductor stack structures 10 in the resin layer 31 while exposing the second surface 12 from the resin layer 31. The pushing depth for the light emitting element 1 can preferably be 50 to 115%, more preferably 85 to 110%, even more preferably 90 to 100% of the thickness t of the semiconductor stack structure 10. The pushing depth is defined as the distance between the upper surface of the resin layer 31 prior to pushing and the first surfaces 11 subsequent to pushing.

(d) First Heating Step

In the first heating step, the viscosity of the resin layer 31 is lowered by heating the resin layer 31 at a first temperature without applying the load to the light emitting elements 1. In this manner, the positions of the upper surface of the resin layer 31 and the second surfaces 13 of the semiconductor stack structures 10 are adjusted. In the case in which the semiconductor stack structures 10 of the light emitting elements 1 are partly embedded as shown in FIG. 2A, the light emitting elements 1 are allowed to sink using their own weight such that the second surfaces 12 of the semiconductor stack structures 10 are exposed from the upper surface of the resin layer 31. In the case in which the semiconductor stack structures 10 are entirely embedded as shown in FIG. 2B, the buoyancy of the light emitting elements 1 can be used to allow the light emitting elements 1 to ascend such that the second surfaces 12 of the semiconductor stack structures 10 become flush with the upper surface of the resin layer 31.

Lowering the viscosity of the resin layer 31 can reduce the size of the raised portions 33 created in the load application step.

In the first heating step, the height of the raised portions 33 is preferably reduced to be lower than the height of the electrodes 20, more preferably, the raised portions 33 are allowed to disappear. The second surfaces 12 of the semiconductor stack structures 10 are preferably flush with the upper surface of the resin layer 31.

The first heating step is performed without applying the load to the light emitting elements 1. In other words, the first heating step is performed after cancelling the load applied in the load application step. In the case in which a plate 36 is used in the load application step, the first heating step may be performed with the plate 36 still in place or after removing the plate 36. In the case of performing the first heating step with the plate 36 still in place, the load attributable to the weight of the plate 36 is not considered as the load applied to the light emitting element. In other words, "without applying the load to the light emitting element 1" is simply a state in which the load applied via the plate has been cancelled.

Figure 1D:
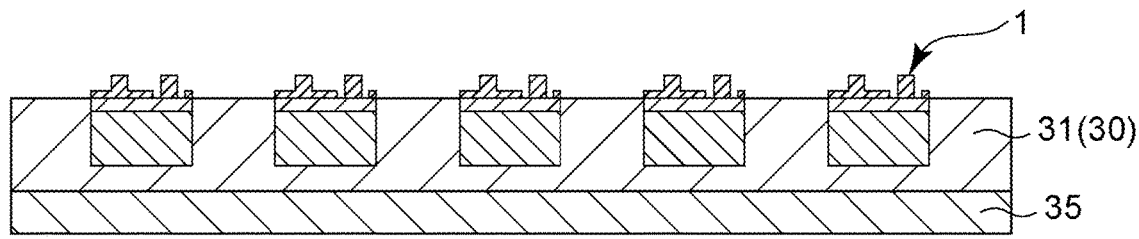
FIG. 1D is a schematic cross-sectional view illustrating a light emitting device manufacturing step according to the first embodiment.

The first temperature used to heat the resin layer 31 is suitably set to lower the viscosity of the resin material that composes the resin layer 31 such that the second surfaces 12 of the semiconductor stack structures 10 are exposed from the resin layer 31 and the lateral surfaces 13 of the semiconductor stack structures 10 are entirely in contact with the resin in the resin layer 31 as shown in FIG. 1D.

For example, the first temperature is suitably set in accordance with the type of the resin material from which the resin layer 31 is composed as well as the shape and the weight of the light emitting elements 1. For example, for the resin layer 31 that includes a thermosetting silicone resin, epoxy resin, or acrylic resin, the first temperature can be in a range of 70° C. to 110° C. The heating time can be set, for example, 10 minutes or more.

The first temperature does not necessarily have to be maintained at a specific temperature for a predetermined duration, and may be set to continuously increase. In other words, it is sufficient that the temperature range that allows for sinking the light emitting elements in the softened resin layer is between the temperature at which the rising of the temperature is started and the temperature at which the rising is ended (e.g., the second temperature), and this can achieve the aimed sunk state. For example, when the second temperature to be described later is set to 150° C., the temperature is preferably raised from 60° C. to 150° C. over an hour, and in particular, it is preferable that the temperature is gradually raised in a range from 70° C. to 110° C., the range including the first temperature.

(e) Second Heating Step

As shown in FIG. 1D, the resin layer 31 is heated at a second temperature higher than the first temperature to harden in the state in which the second surfaces 12 are exposed from the resin layer 31. This causes the resin layer 31 in its A-stage state to be in its C-stage state, so that a resin member 30 is formed.

The second temperature that hardens the resin layer 31 is suitably set based on the hardening temperature of the resin material from which the resin layer 31 is composed. For example, for a resin layer 31 that contains a thermosetting silicone resin, epoxy resin, or acrylic resin, the second temperature is in a range of 150° C. to 200° C. The heating duration can be set, for example, as 1 to 8 hours.

In raising the temperature from the first temperature in the first heating step to the second temperature in this step, the temperature may be continuously raised from the first temperature to the second temperature without lowering it below the first temperature, or the temperature may be lowered once to room temperature (20±5° C.), for example, before being raised to the second temperature. Raising of the temperature can be appropriately set in consideration of efficiency of manufacturing process efficiency and the like.

(f) Step of Singulation

Figure 1E:
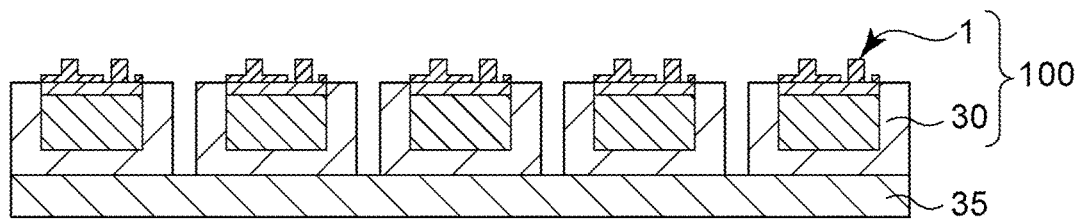
FIG. 1E is a schematic cross-sectional view illustrating a light emitting device manufacturing step according to the first embodiment.

As shown in FIG. 1E, after hardening the resin layer 31, the resin member 30 is cut between adjacent light emitting elements 1. When cut, the lateral surfaces 13 of each light emitting element 1 are covered by the resin member 30 of a predetermined thickness in the directions in which the light emitting elements 1 are arranged.

Figure 1F:
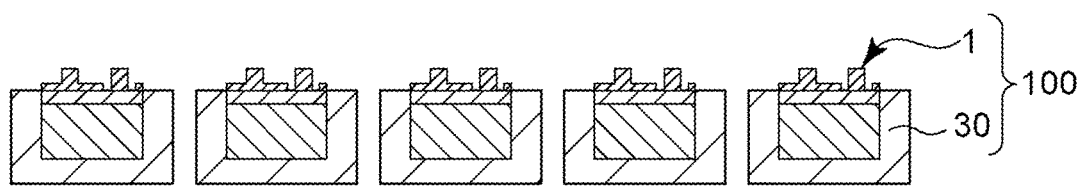
FIG. 1F is a schematic cross-sectional view illustrating light emitting devices 100 obtained by a method of manufacturing a light emitting device according to the first embodiment.

Next, as shown in FIG. 1F, the support 35 is removed from the light emitting devices 100.

The step of singulation can be performed as required. For example, the resin member can be cut such that a light emitting device includes a single light emitting element 1. Alternatively, the resin member 30 can be cut such that a light emitting device including a plurality of light emitting elements 1.

When cutting the resin member such that a light emitting device includes a plurality of light emitting elements 1, a linear light emitting device in which the light emitting elements 1 are arranged in a row, or a planar light emitting device in which the light emitting elements 1 are arranged in a matrix can be produced.

The conditions for each of the steps described above are suitably selected in accordance with the light emitting device to be manufactured. For example, the light emitting elements and the resins to be used for the resin layer described above are suitably selected in accordance with the light emitting device to be manufactured, and in accordance with the selected resins to compose the light emitting elements and the resin layer, the A-stage state of the resin layer in the resin layer disposition step, the embedded depth of the light emitting elements in the load application step, the first temperature in the first heating step, the second temperature in the second heating step, or the like are set.

For example, the first temperature is set to achieve a desired sunk state of the light emitting elements by browsing a database that stores data on various sunk states achieved by various heating temperatures for the resin layer in correspondence with the types and the viscosities of the resins available for the resin layer 31. In the case of performing the first heating step with the plate 36 still in place on the light emitting elements, the weight of the plate 36 applied to the light emitting elements may be added to the weight of each light emitting element 1. As used herein, the settled state of the light emitting elements 1 refers to the positional relationship between the second surfaces 12 of the light emitting elements and the upper surface of the resin layer 31 located between adjacent light emitting elements. The database stores data, such as the temperatures at which the upper surface of the resin layer between adjacent light emitting elements becomes substantially flush with the second surfaces of the light emitting elements, the temperatures at which the upper surface of the resin layer between adjacent light emitting elements becomes lower than the plane that includes the second surfaces of the light emitting elements, the temperatures at which the upper surface of the resin layer between adjacent light emitting elements become higher than the plane that includes the second surfaces of the light emitting elements, and the like. A suitable selection can be made based on the stored data and in consideration of the shape of the light emitting devices to be obtained.

Accordingly, the manufacturing method of the present disclosure can further include a database preparation step of preparing a database that stores, in correspondence with the types of light emitting devices to be manufactured, data on the resins available for the light emitting elements and the resin layers, the A-stage states of the resins available for the resin layers for the resin layer disposition step, the embedded depths of the light emitting elements for the load application step, the first temperatures for the first heating step, and the second temperatures for the second heating step, and a step of setting the embedded depth of the light emitting elements in the load application step, the first temperature in the first heating step, and the second temperature in the second heating step by browsing the database.

In the method of manufacturing a light emitting device of the first embodiment described above, the light emitting elements 1 are embedded in the resin layer 31 by pushing them into the resin layer 31, followed by heating the resin layer at a first temperature lower than the second temperature, which is the hardening temperature of the resin layer 31, to lower the viscosity of the resin layer, so as to expose the second surfaces 12 of the semiconductor stack structures 10. This can prevent the light emitting elements from becoming misaligned or oblique to the vertical direction, and can thus allow for manufacture of light emitting devices in which the surfaces of the semiconductor stack structures of the light emitting elements except for one surface are covered by the resin layer. The manufacturing method according to the present disclosure, which prevents the light emitting elements from becoming misaligned or oblique to the vertical direction, can improve product yield.

In the manner described above, for example, light emitting devices each including a light emitting element 1 whose lateral surfaces 13 are covered by a resin member of a predetermined thickness can be manufactured.

The method of manufacturing a light emitting device according to the first embodiment allows for various modifications such as those described below, and therefore can allow for manufacture of various light emitting devices.

First Variation

A method of manufacturing a light emitting device of a first variation is a method of manufacturing a light emitting device that includes a light emitting element 1 and a resin member 30 containing a phosphor that converts the wavelength of the light from the light emitting element 1.

Specifically, in the method of manufacturing a light emitting device according to the first variation of the first embodiment, a resin containing phosphor particles is used as the resin layer 31. By embedding a light emitting element 1 in the resin layer 31 that contains phosphor particles, a light emitting device in which the semiconductor stack structure surfaces except for the second surface 12 are covered by a wavelength conversion member can be manufactured.

The specific gravity and/or the viscosity of the resin layer 31 containing phosphor particles change in accordance with the particle size, the particle size distribution, and the amount of the phosphor particles contained in the resin. Accordingly, the A-stage state and the first temperature can be suitably set by taking these factors into consideration.

For the phosphor, yttrium aluminum garnet based phosphors (e.g., $Y_3(Al,Ga)_5O_{12}$:Ce), lutetium aluminum garnet based phosphors (e.g., $Lu_3(Al,Ga)_5O_{12}$:Ce), terbium aluminum garnet based phosphors (e.g., $Tb_3(Al,Ga)_5O_{12}$:Ce), CCA-based phosphors (e.g., $Ca_{10}(PO_4)_6Cl_2$:Eu), SAE-based phosphors (e.g., $Sr_4Al_{14}O_{25}$:Eu), chlorosilicate based phosphors (e.g., $Ca_8MgSi_4O_{16}Cl_2$:Eu), nitride based phosphors, such as β-SiAlON based phosphors (e.g., $(Si,Al)_3(O,N)_4$:Eu), α-SiAlON based phosphors (e.g., $Ca(Si,Al)_{12}(O,N)_{16}$:Eu), SLA based phosphors (e.g., $SrLiAl_3N_4$:Eu), CASN-based phosphors (e.g., $CaAlSiN_3$:Eu), or SCASN-based phosphors (e.g., $(Sr,Ca)AlSiN_3$:Eu), fluoride based phosphors, such as KSF-based phosphors (e.g., $K_2SiF_6$:Mn), KSAF-based phosphors (e.g., $K_2Si_{0.99}Al_{0.01}F_{5.99}$:Mn), or MGF-based phosphors (e.g., $3.5MgO\cdot 0.5MgF_2\cdot GeO_2$:Mn), phosphors having a Perovskite structure (e.g., $CsPb(F,Cl,Br,I)_3$), or quantum dot phosphors (e.g., CdSe, InP, $AgInS_2$ or $AgInSe_2$) can be used. For the phosphor added to the resin member 30, one phosphor may be used, or multiple types of phosphors may be used.

KSAF-based phosphors may have a composition represented by the formula (I) below:

$$M_2[Si_pAl_qMn_rF_s] \quad\quad (I)$$

In the formula (I), M represents an alkali metal, and may include at least K. Mn can be tetravalent Mn ions. P, q, r, and s can satisfy $0.9 \leq p+q+r \leq 1.1$, $0 < q \leq 0.1$, $0 < r \leq 0.2$, and $5.9 \leq s \leq 6.1$, preferably, $0.95 \leq p+q+r \leq 1.05$ or $0.97 \leq p+q+r \leq 1.03$, $0 < q \leq 0.03$, $0.002 \leq q \leq 0.02$ or $0.003 \leq q \leq 0.015$, $0.005 \leq r \leq 0.15$, $0.01 \leq r \leq 0.12$ or $0.015 \leq r \leq 0.1$, $5.92 \leq s \leq 6.05$ or $5.95 \leq s \leq 6.025$. Examples of such a composition include the compositions represented by $K_2[Si_{0.946}Al_{0.005}Mn_{0.049}F_{5.995}]$, $K_2[Si_{0.942}Al_{0.008}Mn_{0.050}F_{5.992}]$ and $K_2[Si_{0.939}Al_{0.014}Mn_{0.047}F_{5.986}]$. Such KSAF-based phosphors can emit high luminance red light having a peak emission wavelength with a narrow full width at half maximum.

Second Variation

A method of manufacturing a light emitting device of a second variation is a method of manufacturing a light emitting device that includes a light emitting element 1 and a resin member 30 containing a light diffuser that reflects the light from the light emitting element 1.

Specifically, in the method of manufacturing a light emitting device according to the second variation of the first embodiment, a resin containing light diffusing particles, such as titanium oxide, silicon oxide, aluminum oxide, or zinc oxide, is used as the resin layer 31. By embedding a light emitting element 1 in the resin layer 31 that contains light diffusing particles, a light emitting device in which a light reflecting layer is disposed on the surfaces of the light emitting element 1 except for second surface 12, for example, can be manufactured.

The light emitting device manufactured by the manufacturing method according to the second variation described above is applicable, for example, in manufacturing a light emitting device configured to emit light from the second surface 12 where the electrodes are disposed.

In the manufacturing method according to the second variation, moreover, by removing the resin member 30 disposed on the first surface 11 of the semiconductor stack structure 10 of the light emitting element 1 or embedding the light emitting element 1 such that the first surface 11 of the semiconductor stack structure 10 of the light emitting element 1 is in contact with the support 35, a light emitting device in which no resin member 30 is disposed on the first surface 11 of the semiconductor stack structure 10 of the light emitting element 1 can be manufactured. A light emitting device manufactured in this manner allows the light traveling toward the lateral surfaces of the light emitting element 1 to be reflected and emitted from the first surface 11 of the semiconductor stack structure 10 of the light emitting element 1.

The specific gravity and/or the viscosity of the resin layer 31 containing light diffusing particles change in accordance with the particle size, the particle size distribution, and the amount of the light diffusing particles contained in the resin. Accordingly, the A-stage state and the first temperature can be suitably set by taking these into consideration.

Third Variation

A method of manufacturing a light emitting device of a third variation is a method of manufacturing a light emitting device that includes a light emitting element 1, a light reflecting layer 25 disposed above the first surface 11 of the semiconductor stack structure 10 of the light emitting element 1, and a light transmissive resin member 30 disposed to cover the lateral surfaces 13 of the light emitting element 1.

Figure 1G:
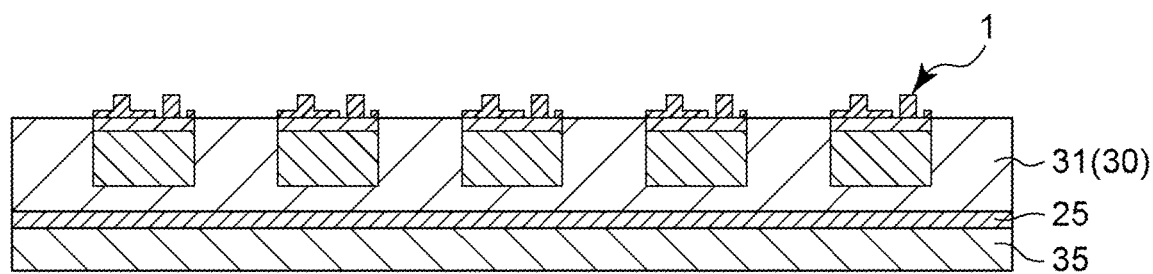
FIG. 1G is a schematic cross-sectional view illustrating a light emitting device manufacturing step according to a third variation of the first embodiment.

Specifically, as shown in FIG. 1G, a hardened light reflecting layer 25 is disposed on the upper surface of the support 35, and a resin layer 31 is disposed on the light reflecting layer 25 in the method of manufacturing a light emitting device according to the first embodiment. The light reflecting layer 25 can be prepared by forming or purchasing one that has already been hardened, and disposed on the support. Alternatively, the light reflecting layer 25 can be prepared by applying a liquid light reflecting material onto the support and hardening the material by heating or the like.

Figure 1H:
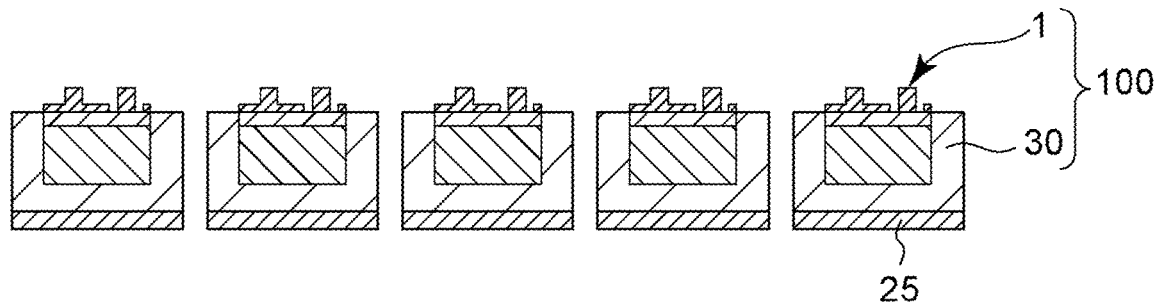
FIG. 1H a schematic cross-sectional view illustrating a method of manufacturing a light emitting device according to the third variation of the first embodiment.

Next, as shown in FIG. 1H, the resin layer 31 is hardened after embedding light emitting elements 1, and cut into individual pieces in the state in which the light reflecting layer 25 is retained above the first surfaces 11 of the semiconductor stack structures 10 of the light emitting elements 1.

This can produce a light emitting device configured to efficiently emit light from the lateral surfaces 13 of the light emitting element 1 while reducing the light upwardly exiting the first surface 11 of the semiconductor stack structure 10 of the light emitting element 1, i.e., exhibit a so-called batwing distribution.

In the manufacturing method of the third variation, a resin member 30 having a wavelength conversion function achieved by including a phosphor in the resin layer 31 may be used.

In the manufacturing method of the third variation, moreover, the distance between the light reflecting layer 25 and the first surface 11 of the semiconductor stack structure 10 of the light emitting element 1 can be changed by adjusting the embedded position of the light emitting element 1 in the resin layer 31 by changing the thickness of the resin layer 31 or adjusting the viscosity of the resin layer 31. This allows for manufacturing light emitting devices having various batwing distribution characteristics.

Fourth Variation

Figure 1I:
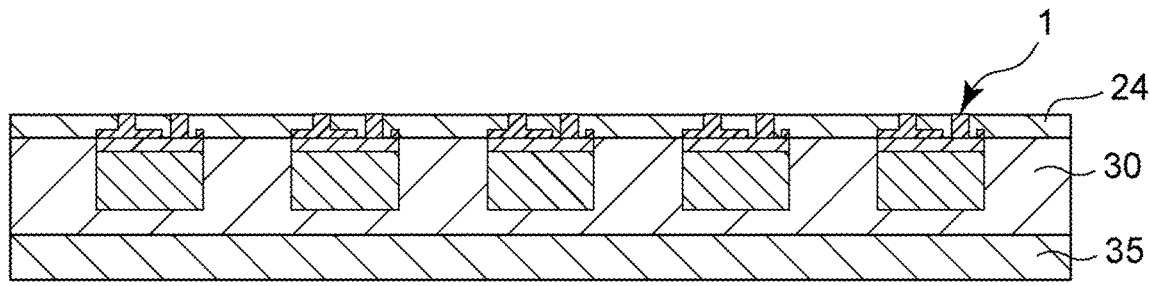
FIG. 1I is a schematic cross-sectional view illustrating a light emitting device manufacturing step according to a fourth variation of the first embodiment.

A manufacturing method according to a fourth variation includes, subsequent to forming a resin member 30 as in the method of manufacturing a light emitting device according to the first embodiment or the first to third variations, a step of disposing a light reflecting layer 24 to cover the second surfaces 12 and the lateral surfaces of the electrodes 20 as shown in FIG. 1I. In a step of disposing a light reflecting layer 24, as shown in FIG. 1I, a light reflecting layer 24 is disposed on the upper surface of the resin member 30 by, for example, roll coating, spraying, or compression forming. At this time, the light reflecting layer 24 is disposed to cover the upper surfaces, excluding the uppermost surfaces and the lateral surfaces of the electrodes 20 so as to expose the uppermost surfaces of the electrodes 20. Alternatively, the light reflecting layer 24 may be disposed to cover the electrodes 20 entirely, followed by grinding from the upper surface of the light reflecting layer 24 to partially remove the electrodes 20 and the light reflecting layer 24, exposing the surfaces of the electrodes 20 from the light reflecting layer 24. The surfaces of the electrodes 20 exposed from the light reflecting layer 24 serve as the uppermost surfaces of the electrodes 20.

In a light emitting device manufactured through the manufacturing method of the fourth variation described above, a second reflecting layer 24 covering the second surface 12 can reflect the light advancing towards the second surface 12 to exit from the first surface 11, allowing emitted light to efficiently exit.

Fifth Variation

A manufacturing method according to a fifth variation is a method as in the third variation that further includes the step of disposing a light reflecting layer 24 that covers the second surface 12 and portions of the electrodes 20 as in the fourth variation.

Figure 1J:
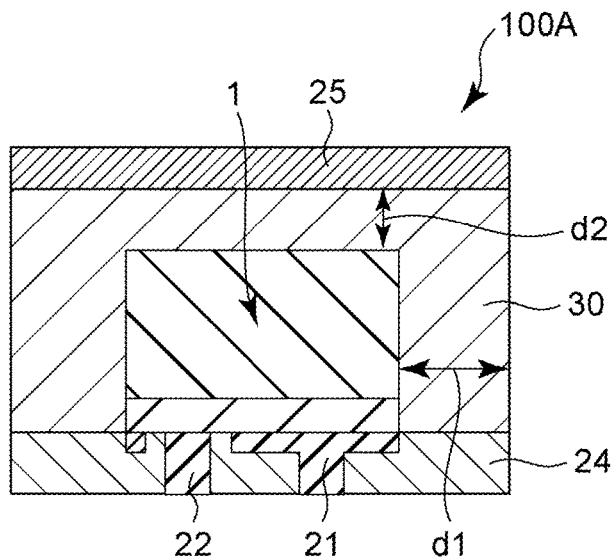
FIG. 1J is a schematic cross-sectional view illustrating a light emitting device 100 obtained by a method of manufacturing a light emitting device according to a fifth variation of the first embodiment.

A light emitting device 100A manufactured by the manufacturing method according to the fifth variation described above, as shown in FIG. 1J, includes a light reflecting layer 25 (first light reflecting layer) disposed above the light emitting element 1, a light transmissive resin member 30 disposed to cover the emission surface and the lateral surfaces of the light emitting element 1, and a second reflecting layer 24 disposed to cover the electrodes 21 and 22 of the light emitting element 1 while exposing the uppermost surfaces of the electrodes 21 and 22.

In the light emitting device 100A, for example, the light reflecting layers 24 and 25 can be formed with a resin containing as a light diffuser titanium oxide, silicon oxide, aluminum oxide, or zinc oxide. For such a resin material, for example, a silicone resin, epoxy resin, or acrylic resin can be used. The light reflecting layers 24 and 25 may be, for example, a metal layer such as platinum, silver, rhodium, or aluminum, or a distributed Bragg reflector (DBR). The light reflecting layers 24 and 25 may be inorganic members.

The distance d1 from the lateral surfaces of the light emitting element 1 to the outer lateral surfaces of the resin member 30 is preferably larger than the distance d2 from the upper surface of the light emitting element 1 to the upper surface of the resin member 30. With this structure, the light that exited the lateral surfaces of the light emitting element 1 can be facilitated to be propagated toward the lateral surfaces of the resin member 30 rather than toward the upper surface of the resin member 30, allowing increase in the percentage of the light that is laterally extracted from the light emitting device 100A. The distance d1 from the lateral surfaces of the light emitting element 1 to the outer lateral surfaces of the resin member 30 is preferably 1.5 to 2.5 times the distance d2 from the upper surface of the light emitting element 1 to the upper surface of the resin member 30, more preferably the distance d1 is 1.9 to 2.1 times the distance d2.

Further, The light emitting device 100A can emit white light when a wavelength conversion member of a sheet shape (hereinafter referred to as a wavelength conversion sheet) containing the phosphor described above is disposed at an upper side of the light emitting device 100A. For example, white light can be obtained by combining a light emitting device configured to emit blue light and a wavelength conversion sheet containing a phosphor configured to emit yellow light. In another example, a light emitting light device configured to emit blue light can be combined with a wavelength conversion sheet containing a phosphor configured to emit red light (hereinafter referred to as red emitting phosphor) and a phosphor configured to emit green light (hereinafter referred to as green emitting phosphor).

A light emitting light device configured to emit blue light may be combined with a plurality of wavelength conversion sheets. For the plurality of wavelength conversion sheets, for example, a wavelength conversion sheet containing a red emitting phosphor and a wavelength conversion sheet containing a green emitting phosphor can be selected. A light emitting device having a light emitting element configured to emit blue light and a light transmissive member containing a red emitting phosphor can be combined with a wavelength conversion sheet containing a green emitting phosphor.

For the yellow emitting phosphor used in a wavelength conversion sheet, for example, any of the yttrium aluminum garnet based phosphors described above is preferably used. For the green emitting phosphor used in a wavelength conversion sheet, a phosphor that emits light having a peak emission wavelength with a narrow full width at half maximum, for example, any of the phosphors having a Perovskite structure or quantum dot phosphors described above is preferably used. For the red emitting phosphor used in a wavelength conversion sheet, similar to green emitting phosphors, a phosphor that emits light having a peak emission wavelength with a narrow full width at half maximum, for example, any of the KSF-based phosphors, KSAF-based phosphors, or quantum dot phosphors described above is preferably used.

Second Embodiment

A method of manufacturing a light emitting device 200 according to a second embodiment of the present disclosure uses as a light emitting device a light emitting device 100 that includes a phosphor (hereinafter referred to as the first phosphor) in the resin member 30 manufactured by the manufacturing method of the first variation of the first embodiment. In the light emitting device 200, a resin member 130 containing a second phosphor different from the first phosphor is further disposed on the resin member 30 of the light emitting device 100.

A light emitting device 100 having a resin member 30 that contains a first phosphor is prepared by using a manufacturing method according to the first variation of the first embodiment. In the second embodiment, the light emitting device 100 is used as a light emitting element.

Figure 3A:
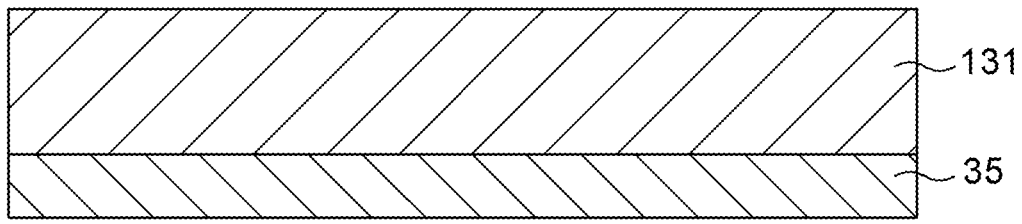
FIG. 3A is a is a schematic cross-sectional view illustrating a light emitting device manufacturing step according to a second embodiment.

Separately from the preparation of the light emitting device 100, a similar step to (a) Resin Layer Disposition Step of the first embodiment is performed. Specifically, as shown in FIG. 3A, by disposing an uncured resin containing a second phosphor on the support 35, a resin layer 131 in its A-stage state can be disposed. For the resin included in the resin layer 131, a similar resin to that used in the first embodiment can be used. Preferably, a similar resin to the resin composing the resin layer 31 in the first embodiment is used.

Figure 3B:
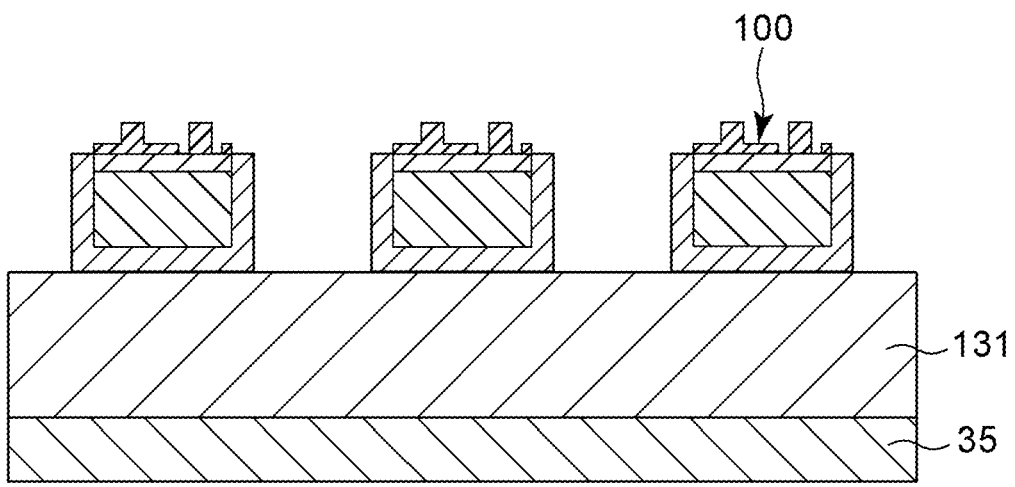
FIG. 3B is a is a schematic cross-sectional view illustrating a light emitting device manufacturing step according to the second embodiment.

Next, a similar step to (b) Light Emitting Element Mounting Step of the first embodiment is performed. Specifically, while maintaining the A-stage state of the resin layer 131 disposed on the support 35, light emitting devices 100 are mounted such that the emission surfaces of the light emitting devices 100 face the upper surface of the resin layer 131 as shown in FIG. 3B. The light emitting devices 100 are arranged at predetermined intervals, for example, in a matrix, in consideration of the thickness of the resin member 130 that covers the lateral surfaces of the light emitting devices 100 in light emitting devices 200 to be obtained.

Figure 3C:
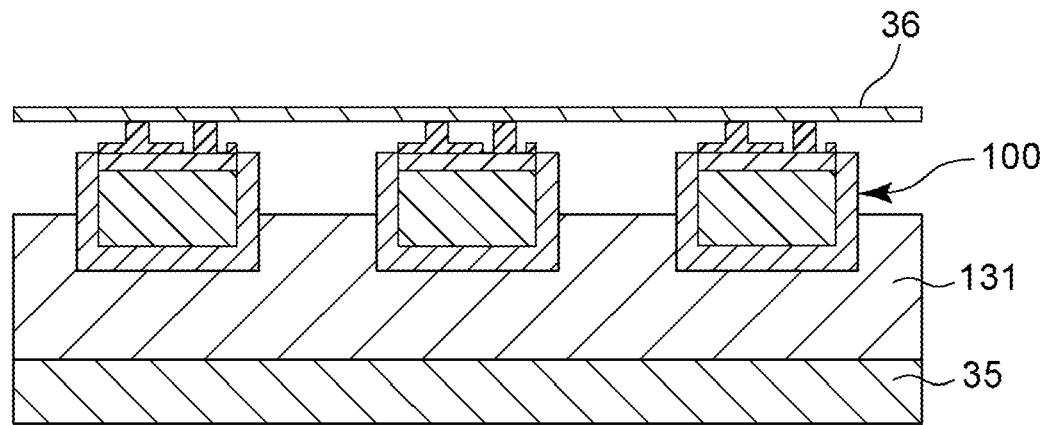
FIG. 3C is a is a schematic cross-sectional view illustrating a light emitting device manufacturing step according to the second embodiment.

Next, a similar step to (c) Load Application Step of the first embodiment is performed. Specifically, a downward load (downward in the drawing) is applied to the light emitting devices 100 using a plate 36 to push the light emitting devices 100 partly into the resin layer 131. After this step, as shown in FIG. 3C, the light emitting devices 100 are partly embedded in the resin layer 131.

Figure 3D:
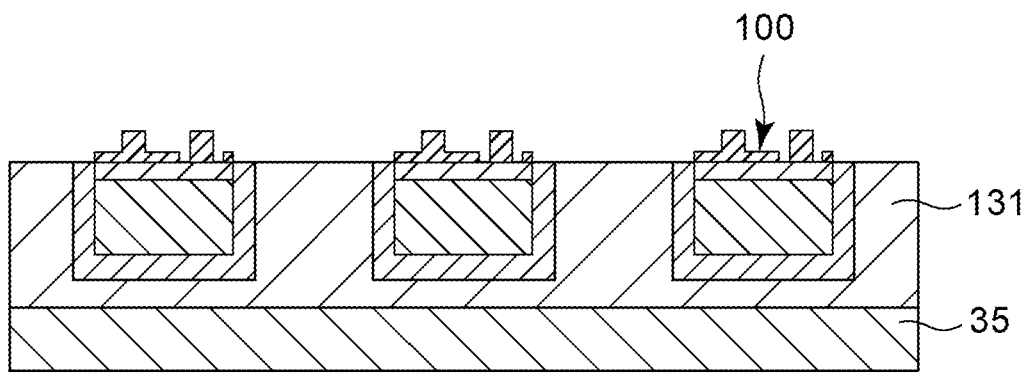
FIG. 3D is a is a schematic cross-sectional view illustrating a light emitting device manufacturing step according to the second embodiment.

Next, in a similar manner to in (d) First Heating Step of the first embodiment, the resin layer 131 is heated at a first temperature to lower the viscosity of the resin layer 131 to adjust the positions of the upper surface of the resin layer 131 and the electrode formed surfaces of the light emitting devices 100. In this embodiment, as shown in FIG. 3D, the light emitting devices 100 are allowed to sink by using their own weight such that the electrode formed surfaces of the light emitting devices 100 are exposed from the resin layer 131.

Figure 3E:
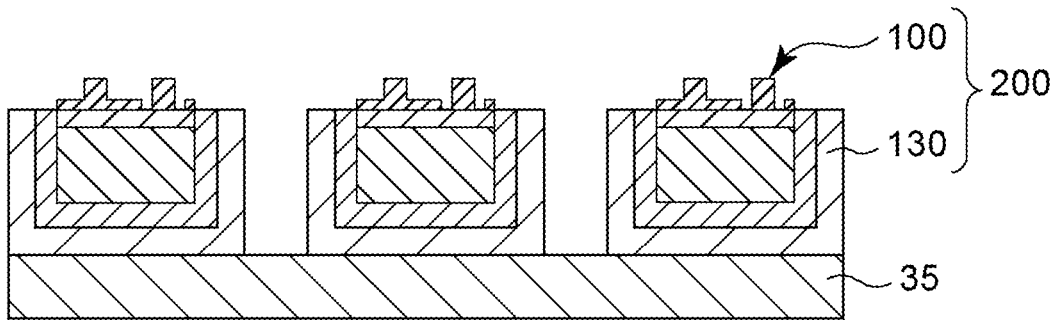
FIG. 3E is a is a schematic cross-sectional view illustrating a light emitting device manufacturing step according to the second embodiment.
Figure 3F:
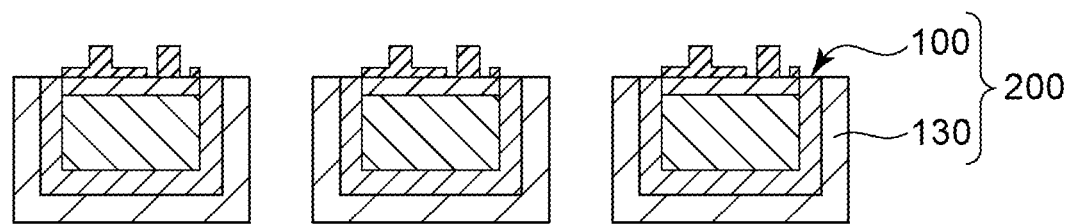
FIG. 3F is a schematic cross-sectional view illustrating light emitting devices 200 obtained by a method of manufacturing a light emitting device according to the second embodiment.

In a similar manner to in (e) Second Heating Step of the first embodiment, the resin layer 131 is heated to harden at a second temperature higher than the first temperature, and in a similar manner to in (f) Step of Dividing into Individual Pieces of the first embodiment, as shown in FIG. 3E, the resin member is cut between adjacent light emitting devices 100 such that the resin member 130 covering the lateral surfaces of each of the light emitting devices 100 has a predetermined thickness. FIG. 3F shows the cross sections of the light emitting devices 200 after removing the support.

According to the method of manufacturing a light emitting device of the second embodiment described above, light emitting devices 200 each having a light emitting element 1, a resin member 30 covering the surfaces of the light emitting element 1 except for the second surface 12, and a second resin member 130 covering the resin member 30 can be manufactured while preventing the light emitting elements from becoming misaligned or oblique to the vertical direction.

In Embodiments 1 and 2 described above, examples of light emitting devices in which the light emitting elements 1 or the light emitting devices 100 are allowed to sink so as to make the surface of the resin layer 31 or 131 between adjacent light emitting elements 1 or light emitting devices 100 flat have been described. However, the method of manufacturing a light emitting device according to the present disclosure is not limited to this.

Figure 4A:
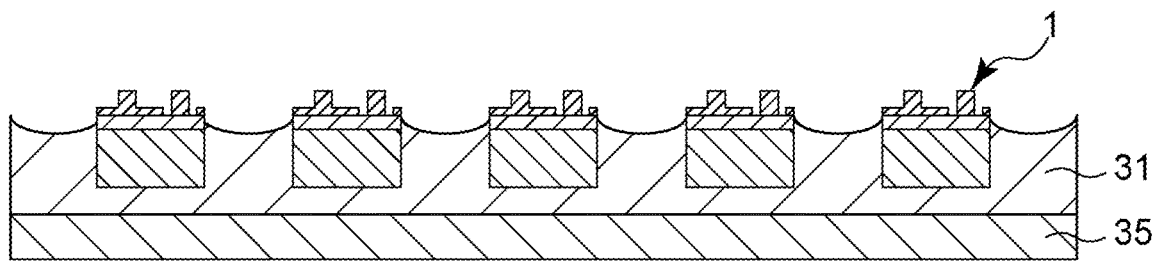
FIG. 4A is a schematic cross-sectional view illustrating a light emitting device manufacturing step according to a Variation of the first embodiment.

For example, as shown in FIG. 4A, the positions of the light emitting elements 1 or the light emitting devices 100 may be adjusted such that the surface of the resin layer 31 or 131 between adjacent light emitting elements 1 or light emitting devices 100 is a curved face.

Such a state can be achieved by suitably adjusting the viscosity of the resin layer 31 or 131 in its A-stage state, the first temperature for heating, and the wettability of the resin layer 31 or 131 on the lateral surfaces of the light emitting elements 1 or the light emitting devices 100.

Figure 4B:
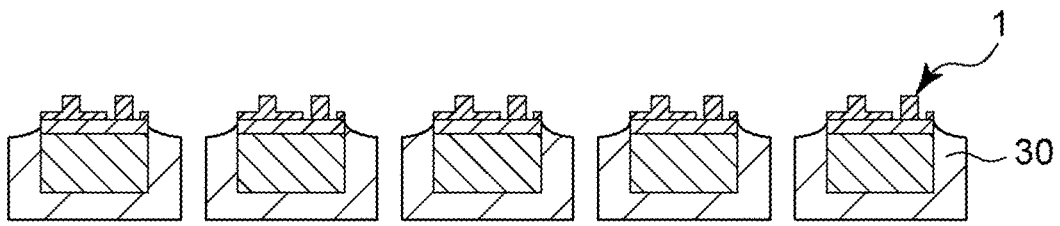
FIG. 4B is a schematic cross-sectional illustrating light emitting devices obtained by a method of manufacturing a light emitting device according to a Variation of the first embodiment.

FIG. 4B shows the cross sections of the light emitting devices after hardening the resin layer 31 in the state shown in FIG. 4A, cutting the resin layer, and removing the support 35.

The light emitting devices shown in FIG. 4B may further include a light reflecting layer (corresponding to the light reflecting layer 24 shown in FIG. 1J) covering the second surface of each light emitting element and the lateral surfaces of the electrodes, further covering continuously from the second surface the oblique surface of the resin member 30. When constructed as above, in the case of using a light transmissive resin for the resin member 30, the light can be reflected by the oblique surface of the resin member 30 covered by the light reflecting layer to be extracted. To obtain such a light emitting device, the light reflecting layer can be disposed to cover the light emitting elements except for the uppermost surfaces of the electrodes and the depressed surface of the resin member 30 in the state shown in FIG. 4A, and then singulation can be performed.

Figure 5A:
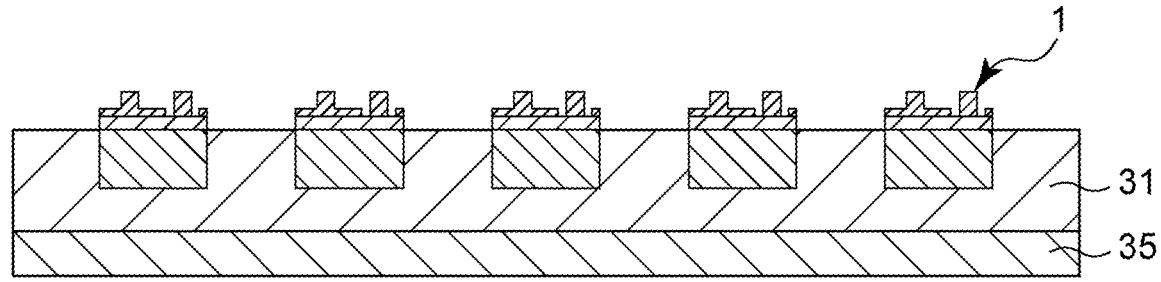
FIG. 5A is a schematic cross-sectional view illustrating a light emitting device manufacturing step according to another Variation of the first embodiment.

As shown in FIG. 5A, the light emitting elements 1 or the light emitting devices 100 may be sunk such that the resin layer 31 or 131 covers the lateral surfaces of the light emitting elements 1 or the light emitting devices 100 partway.

The light emitting elements 1 or the light emitting devices 100 can be sunk to achieve this state by suitably adjusting the weight of the light emitting elements 1 or light emitting devices 100, the viscosity of the resin layer 31 or 131, the first temperature used for heating, and the wettability of the resin layer 31 or 131 on the lateral surfaces of the light emitting elements 1 or light emitting devices 100.

Figure 5B:
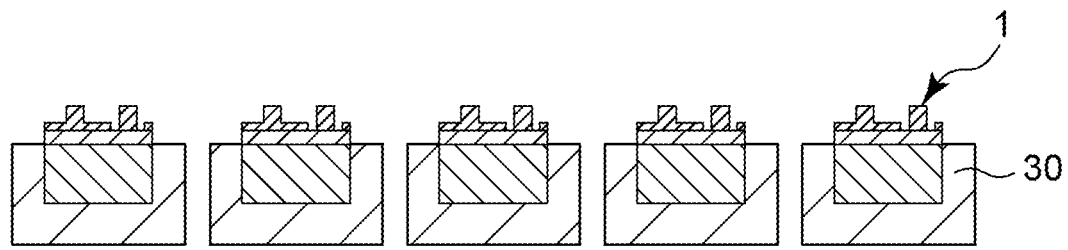
FIG. 5B is a schematic cross-sectional view illustrating light emitting devices obtained by a method of manufacturing a light emitting device according to the Variation of the first embodiment.

FIG. 5B shows the cross sections of the light emitting devices after hardening the resin layer 31 in the state shown in FIG. 5A, cutting, and removing the support 35.

Third Embodiment

A method of manufacturing a light emitting device 300 according to a third embodiment of the present disclosure uses a plurality of light emitting devices 100 manufactured by the manufacturing method according to the first variation of the first embodiment as light emitting elements. In the light emitting device 300, the light emitting devices 100 are embedded in a resin member 230 that contains a light diffuser. The resin member 30 in each light emitting device 100 contains a phosphor.

Figure 6A:
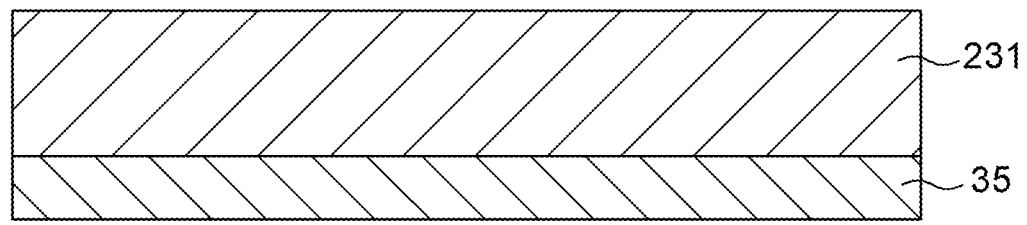
FIG. 6A is a schematic cross-sectional view illustrating a light emitting device manufacturing step according to a third embodiment.
Figure 6B:
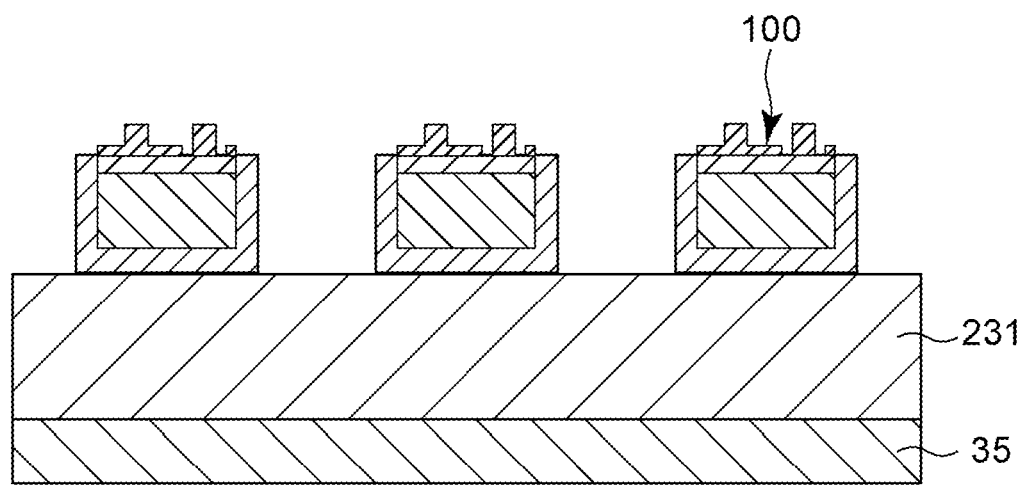
FIG. 6B is a schematic cross-sectional view illustrating a light emitting device manufacturing step according to the third embodiment.
Figure 6C:
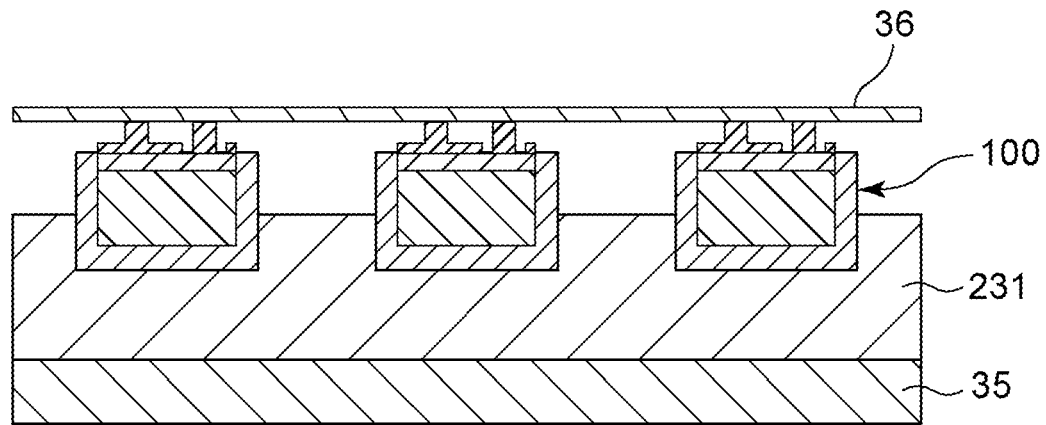
FIG. 6C is a schematic cross-sectional view illustrating a light emitting device manufacturing step according to the third embodiment.
Figure 6C:
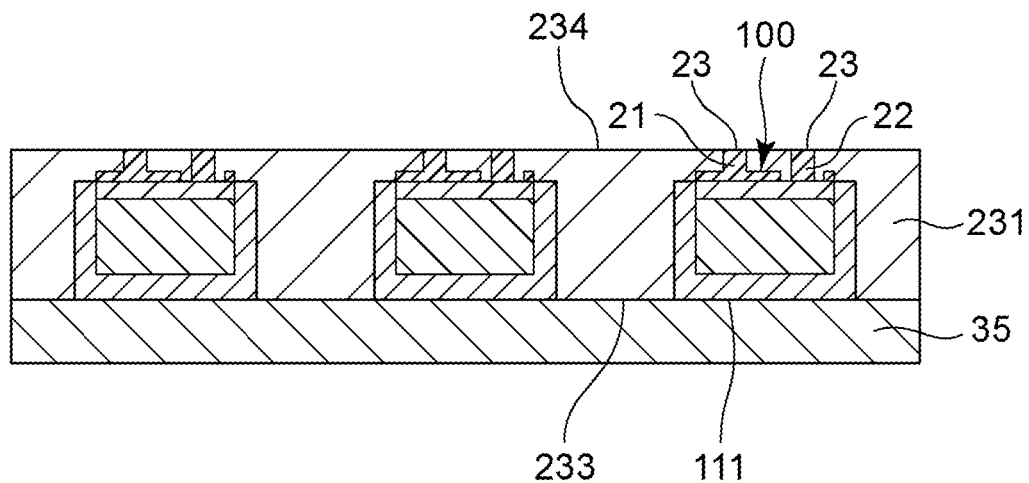
Figure 6F:
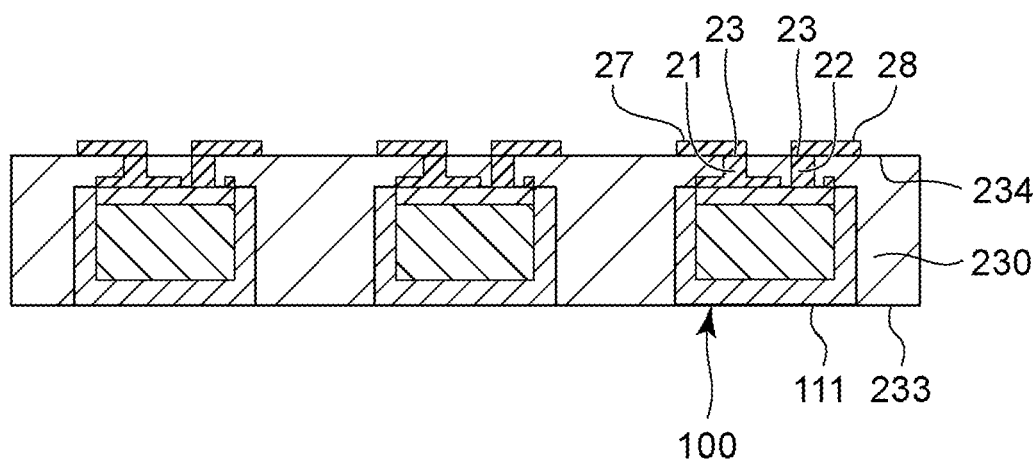
FIG. 6F is a schematic cross-sectional view illustrating a light emitting device 300 obtained by a method of manufacturing a light emitting device according to the third embodiment.
Figure 6G:
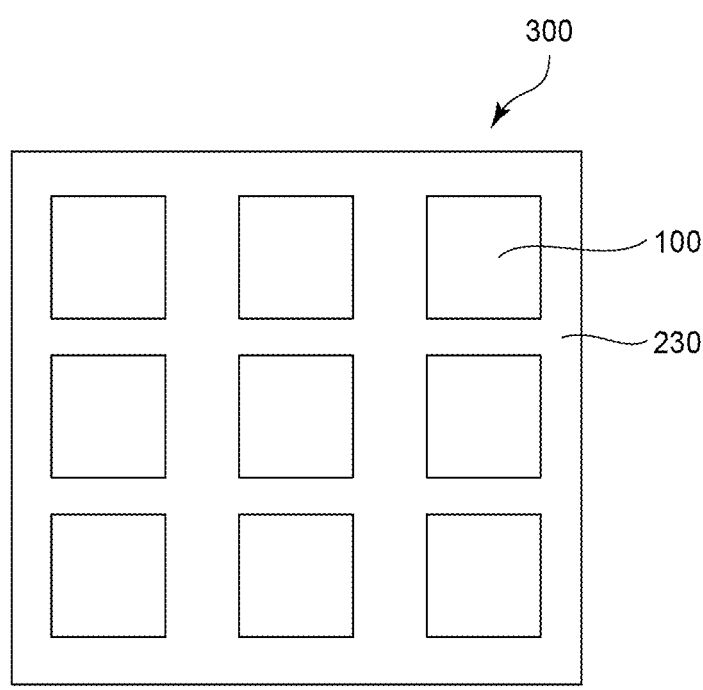
FIG. 6G is a schematic plan view illustrating the emission surface of the light emitting device 300 obtained by the method of manufacturing a light emitting device according to the third embodiment.
Figure 6H:
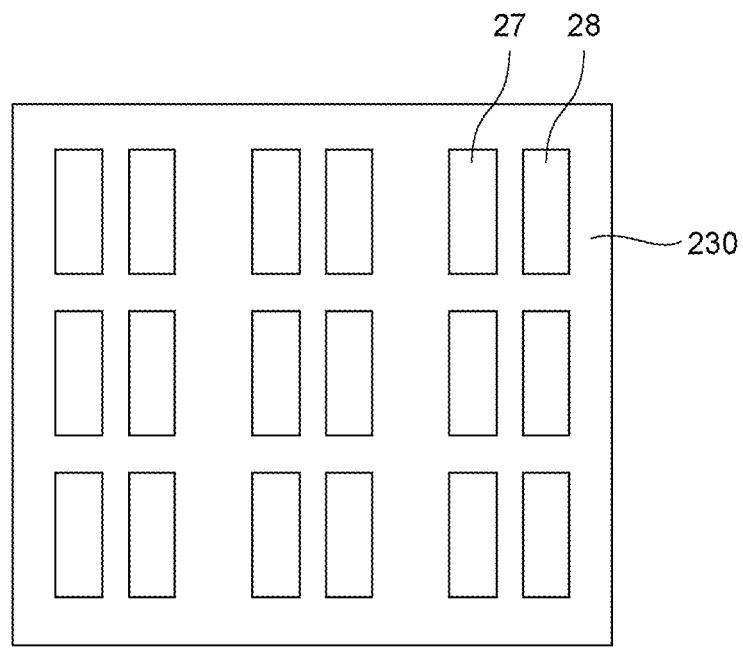
FIG. 6H is a schematic plan view illustrating the terminal electrode surface of the light emitting device 300 obtained by the method of manufacturing a light emitting device according to the third embodiment.

The light emitting devices 100 are arranged in a matrix as shown in FIG. 6G, and embedded in the resin member 230 so as to expose the emission surfaces 111 and the uppermost surfaces 23 of the electrodes 21 and 22 from the first surface 233 and the second surface 234, respectively, of the resin member 230 as shown in FIG. 6F. As shown in FIG. 6F and FIG. 6H, on the second surface 234 of the resin member 230, first terminal electrodes 27 and second terminal electrodes 28 are arranged and respectively connected to the first electrodes 27 and the second electrodes 28 exposed from the resin member 230. The resin member 230 contains particles of a light diffuser, such as titanium oxide, silicon oxide, aluminum oxide, or zinc oxide. In the light emitting device 300, the light emitting devices 100 can be independently driven to emit light.

Light emitting devices 100 each having a resin member 30 that contains a first phosphor are prepared by a manufacturing method according to the first variation of the first embodiment. In the third embodiment, the light emitting devices 100 are used as light emitting elements.

Separately from the preparation of the light emitting devices 100, a similar step to (a) Resin Layer Disposition Step of the first embodiment is performed. Specifically, as shown in FIG. 6A, by disposing an uncured resin containing a light diffuser on a support 35, a resin layer 231 in its A-stage state is disposed. For the resin included in the resin layer 231, a similar resin to that used in the first embodiment can be used. Preferably, a similar resin to that composing the resin layer 31 in the first embodiment is used.

Next, a similar step to (b) Light Emitting Element Mounting Step of the first embodiment is performed.

Specifically, while maintaining the A-stage state of the resin layer 231 disposed on the support 35, light emitting devices 100 are mounted to such that their emission surfaces face the upper surface of the resin layer 231 as shown in FIG. 6B. The light emitting devices 100 are arranged in a matrix at predetermined intervals in consideration of the thickness of the resin member 230 covering the lateral surfaces of the light emitting devices 100 in the light emitting device 300 to be obtained.

Next, a similar step to (c) Load Application Step of the first embodiment is performed. Specifically, a downward load (downward in the drawing) is applied to the light emitting devices 100 using a plate 36 to push the light emitting devices 100 partly into the resin layer 231. After this step, as shown in FIG. 6C, the light emitting devices 100 are partly embedded in the resin layer 231.

Next, in a similar manner to in (d) First Heating Step of the first embodiment, the resin layer 231 is heated at a first temperature to lower the viscosity of the resin layer 231 such that the upper surface of the resin layer 231 is flush with the uppermost surfaces 23 of the electrodes 21 and 22 of the light emitting devices 100 as shown in FIG. 6D1. In this embodiment, the light emitting devices 100 are allowed to sink by using their own weight such that the uppermost surfaces 23 of the electrodes 21 and 22 of the light emitting devices 100 are exposed from the first surface 233 of the resin layer 231. After the first heating step, the plate 36 is removed. The plate 36 may be removed at a different point in time, for example, after the completion of the light emitting element mounting step or the second heating step.

Next, in a similar manner to in (e) Second Heating Step of the first embodiment, the resin layer 231 is heated to harden at a second temperature higher than the first temperature to form a resin member 230.

Then, as shown in FIG. 6E, a metal layer 26 is formed on the second surface 234 of the resin member 230 and the uppermost surfaces 23 of the electrodes 21 and 22. The metal layer 26 may be a separately produced metal foil adhered thereto, or may be formed by sputtering or plating.

Next, patterning of the metal layer 26 is performed to form first terminal electrodes 27 and second terminal electrodes 28 as shown in FIG. 6F. Patterning can be performed by laser irradiation, etching, or the like.

As shown in FIG. 6D1, the light emitting devices 100 have the same thickness as that of the resin layer 231, and the emission surfaces 111 of the light emitting devices 10 and the uppermost surfaces of the electrodes 21 and 22 are respectively exposed from the first surface 233 and the second surface 234 of the resin layer 231 after the first heating step. The third embodiment is not limited to this, and the emission surfaces 111 of the light emitting devices 100 may be positioned in the resin layer 231, i.e., not exposed, which can be achieved by making the resin layer 231 thicker than the light emitting devices 100 as shown in FIG. 6D2, for example. In this case, the emission surfaces 111 of the light emitting devices 100 are exposed by removing the support 35 and grinding the resin member 230 after the second heating step.

Fourth Embodiment

A fourth embodiment of the present disclosure relates to a planar light source in which a plurality of light sources produced by any of the manufacturing methods of the present disclosure are arranged, for example, in a matrix.

The embodiment will be specifically explained below with reference to FIG. 7. A planar light source that employs light emitting devices 100A manufactured by a manufacturing method according to the fifth variation of the first embodiment as light sources will be explained below. The planar light source according to the fourth embodiment, however, is not limited to this. For example, the light emitting elements 1 described with reference to the first embodiment may be used as light sources, or the light emitting devices manufactured by the method according to the second embodiment may be used as light sources.

Figure 7:
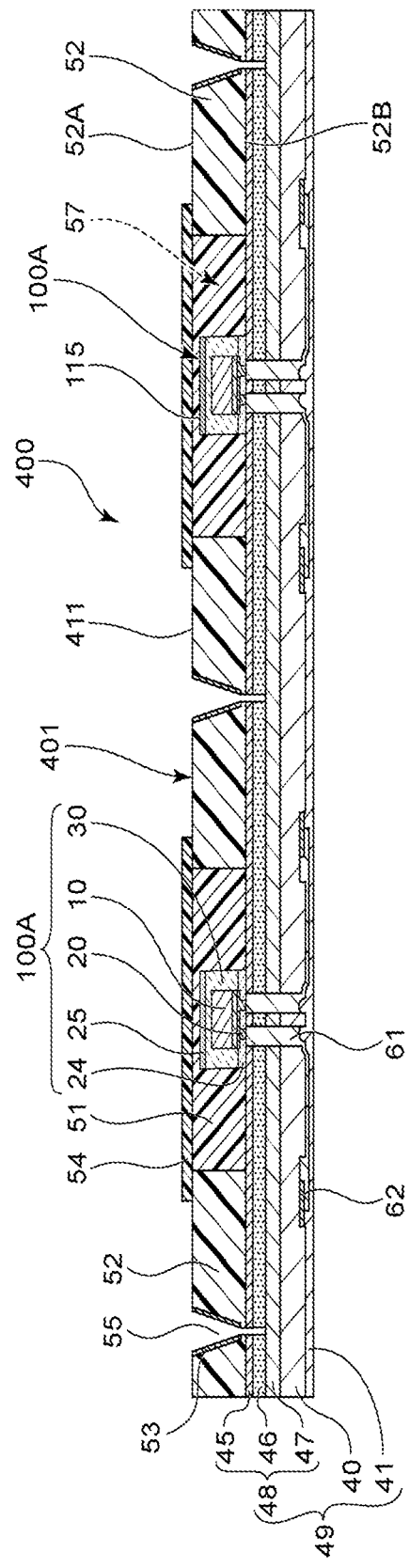
FIG. 7 is a schematic cross-sectional view illustrating a planar light source according to a fourth embodiment.

FIG. 7 is a schematic cross-sectional view of any two adjacent light guide parts in a planar light source 400.

The planar light source 400 includes a support member 49 and light emitting modules 401 arranged on the support member 49.

The support member 49 includes a wiring substrate 40, an electrode protecting layer 41 disposed on one of the principal surfaces of the wiring substrate 40 on which electrodes are formed, and a combination sheet member 48 disposed on the other principal surface of the wiring substrate 40. The combination sheet member 48 includes a first adhesive layer 47, a light reflecting layer 46, and a second adhesive layer 45. The light emitting modules 401 each include a light emitting device 100A as a light source, a sealing member 51 that seals the light emitting device 100A, a light guide part 52, a light reflecting member 53, and a light shielding member 54.

For the material for the light guide part 52, for example, a thermoplastic resin, such as acrylic, polycarbonate, cyclic polyolefin, polyethylene terephthalate, or polyester, a thermosetting resin, such as epoxy or silicone, or glass can be used.

The light guide part 52 preferably has a thickness of 200 µm to 800 µm, for example. The light guide part 52 may be of a single layer or multilayer structure in the direction of thickness. In the case of a multilayer structure, a light transmissive adhesive material may be disposed between layers of the light guide part 52. Main materials of the layers of the multilayer structure may be different from each other. For the adhesive material, for example, a thermoplastic resin, such as acrylic, polycarbonate, cyclic polyolefin, polyethylene terephthalate, or polyester, or a thermosetting resin, such as epoxy or silicone, can be used.

The light guide part 52 has a hole 57 in which a light emitting device 100A is disposed. The hole 57 is a through hole extending from the first principal surface 52A to the second principal surface 52B of the light guide part 52. A demarcating groove 55 is present between adjacent light guide parts 52. In other words, the lateral surfaces of adjacent light guide parts 52 define demarcating grooves 55. The demarcating grooves 55 go through the light guide parts 52 in the direction of thickness.

Each light emitting device 100A is positioned on the second principal surface 52B side of the light guide part 52. In other words, the distance between the center of the light emitting device 100A in the direction of thickness and the second principal surface 52B is smaller than the distance between the center of the light emitting device 100A in the direction of thickness and the first principal surface 52A.

A light reflecting member 53 is disposed on each wall surface of the demarcating grooves 55. In other words, the light reflecting members 53 are disposed to cover the lateral surfaces of the light guide parts 52. In FIG. 7, the light reflecting members 53 are disposed on the wall surfaces of the demarcating grooves 55 in the form of a layer, but may be in other appropriate form. The light reflecting members may be disposed to fill the demarcating grooves 55.

For the light reflecting members 53, for example, a resin containing a light diffuser can be used. The light diffuser is, for example, $TiO_2$ particles. Other examples of light diffusers include particles of $Nb_2O_5$, $BaTiO_3$, $Ta_2O_5$, $Zr_2O_3$, $ZnO$, $Y_2O_3$, $Al_2O_3$, $MgO$, $BaSO_4$, and the like. For the light reflecting members 52, for example, a metal material, such as Al or Ag, may be used.

The light emitting modules 401 are disposed on the support member 49 such that the second principal surfaces 52B of the light guide parts 52 face the upper surface of the sheet member 48.

The light emitting devices 100A are disposed on the sheet member 48 in the holes 57 of the light guide parts 52. The number of light emitting devices 100A disposed in a single light guide part 52, i.e., the lightguide 52 surrounded by the demarcating grooves 55, is not limited to one, i.e., a plurality of light emitting devices 100A may be disposed.

Each light emitting device 100A is sealed in a hole 57 by a sealing members 51. The sealing member 51 is disposed to fill the hole 57.

The sealing members 51 has light transmissivity with respect to the emitted light from the light emitting device 100A, and can be composed of the same resin material as that for the light guide parts 52 or a resin having a small refractive index difference from that of the material used for the light guide parts 52.

The sealing member 51 may be made up of one or more members. For example, the sealing member 51 may be made up of a light transmissive member disposed on the lateral surfaces of a light emitting device 100A, a wavelength conversion member disposed on the upper surface 115 of the light emitting device 100A, and a light transmissive member disposed on the wavelength conversion member.

A light shielding member 54 is disposed on each sealing member 51. The light shielding members 54 have light reflectivity and transmissivity with respect to the light emitted by the light emitting devices 100A. The light shielding members 54 can be composed of a light transmissive resin and a light diffuser contained in the light transmissive resin. The light transmissive resin is, for example, a silicone resin, epoxy resin, or acrylic resin. Examples of light diffusers include particles of $TiO_2$, $SiO_2$, $Al_2O_3$, $ZnO$, or glass. The light shielding member 54 can be disposed to cover the upper surface of the sealing member 51 entirely or partly. The light shielding member 54 can extend beyond the upper surface of the sealing member 51 onto the first principal surface 52A of the light guide part 52 in the periphery of the upper surface of the sealing member 51.

A light shielding member 53 is positioned to overlap a light emitting device 100A in a plan view. In other words, the light shielding member 54 is disposed to fully cover the light emitting device 100A in a plan view. The light shielding member 54 may be larger than the light emitting device 100A in a plan view.

The light shielding member 54 reflects a portion of the light exiting the light emitting device 100A in the upward direction while transmitting the other portion. This can prevent the luminance directly above the light emitting device 100A in the first principal surface 411, which is the emission surface (the light exiting face) of the planar light source 400, from becoming excessively high as compared to the luminance of the other region. This, in other words, can reduce the luminance non-uniformity of the light exiting individual light guide parts 52 defined by the demarcating grooves 55.

The support member 49 includes an electrode protecting layer 41, a wiring substrate 40, and a combination sheet member 48. The combination sheet member 48 includes a first adhesive layer 47, a light reflecting layer 46, and a second adhesive layer 45. In the support member 49, the electrode protecting layer 41, the wiring substrate 40, the first adhesive layer 47, the light reflecting layer 46, and the second adhesive layer 45 are successively disposed.

The first adhesive layer 47 is disposed between the wiring substrate 40 and the light reflecting layer 46, adhering the wiring substrate 40 and the light reflecting layer 46. The second adhesive layer 45 is disposed between the light reflecting layer 46 and the light emitting modules 401, adhering the light reflecting layer 46 and the light emitting modules 401. The light emitting devices 100A are disposed on the second adhesive layer 45 in the holes 57.

The second adhesive layer 45 has light transmissivity with respect to the emitted light from the light emitting devices 100A. For the first adhesive layer 47 and the second adhesive layer 45, for example, an epoxy resin, acrylic resin, or cyclic polyolefin resin is used.

The light reflecting layer 46 is disposed across the entire lower surfaces of the light emitting modules 401.

The light reflecting layer 46 has reflectivity with respect to the emitted light from the light emitting devices 100A.

For the light reflecting layer 46, for example, a resin material containing a large number of air bubbles or a resin material containing a light diffuser can be used. The resin material is, for example, a polyethylene terephthalate (PET) resin, cyclic polyolefin resin, acrylic resin, silicone resin, urethane resin, or epoxy resin. For the light diffuser, for example, $SiO_2$, $CaF_2$, $MgF_2$, $TiO_2$, $Nb_2O_5$, $BaTiO_3$, $Ta_2O_5$, $Zr_2O_3$, $ZnO$, $Y_2O_3$, $Al_2O_3$, $MgO$, or $BaSO_4$ can be used.

The wiring substrate 40 includes an insulation base and at least one wiring layer. Connection parts 62 are disposed on the rear surface of the wiring substrate 40 that opposes the face on which the first adhesive layer 47 is disposed. The rear surface of the wiring substrate 40 is covered by the electrode protecting layer 41.

In the support member 49, conductive members 61 are disposed under the light emitting devices 100A. At least some portions of the electrodes 20 of the light emitting devices 100A are located on and connected to the conductive members 61.

Each conductive member 61 goes through the combination sheet member 48 and the insulation base of the wiring substrate 40, and further extends from the through portion to a connection part 62. The conductive members 61 have conductivity, electrically connecting the electrodes 20 of the light emitting devices 100A and the connection parts 62. The conductive members 61 are made of a conductive paste composed of a resin binder in which a conductive filler is dispersed, for example. The conductive members 61 can contain a metal, such as copper or silver, as a filler. The filler is in the form of particles or flakes.

As described above, in the planar light source 400 of the fourth embodiment, the light guided through the light guide parts 52 towards the second principal surfaces 52B of the guided parts is reflected by the light reflecting layer 46 towards the first principal surface 411, the emission surface, of the planar light source 400. This can increase the luminance of the light extracted from the first principal surface 411.

The light from the light emitting devices 100A is guided through the light guide parts 52 towards the demarcating grooves 55 while repeating total internal reflection between the light reflecting layer 46 and the first principal surfaces 52A of the light guide parts 52. A portion of the light that has traveled toward the first principal surfaces 52A is extracted from the light guide parts 52 through the first principal surfaces 52A.

The present disclosure provides a manufacturing device for manufacturing the light emitting devices described above. Specifically, the present disclosure provides a manufacturing device configured to manufacture a light emitting device that has a light emitting element, including a semiconductor stack structure having a first surface, a second surface opposite to the first surface, and the lateral surfaces between the first surface and the second surface, and electrodes disposed on the second surface of the semiconductor stack structure, in which the lateral surfaces of the semiconductor stack structure are covered by a resin member, the manufacturing device including:

(a) a light emitting element mounting unit configured to mount the light emitting elements such that the first surfaces face the upper surface of a resin layer in its A-stage state disposed on a support;
(b) a load applying unit configured to apply a load to the light emitting elements,
(c) a heating unit configured to heat the resin layer, and
(d) a control unit configured to control the load applying unit such that the load applied to the light emitting element buries the semiconductor stack structures at least partly in the resin layer while exposing the second surfaces from the resin layer, and to control the heating unit to heat the resin layer at a first temperature in the absence of the load to reduce the viscosity of the resin layer and subsequently heat the resin layer at a second temperature higher than the first temperature to harden in the state in which the second surfaces are exposed from the resin layer.

The light emitting element mounting unit mounts light emitting elements on a resin layer in its A-stage state disposed on a support, i.e., performs the light emitting element mounting step of any of the manufacturing methods of the present disclosure. The light emitting element mounting unit can include various device handlers. The resin layer in its A-stage state disposed on the support is separately prepared by performing, for example, the resin layer disposition step in any of the manufacturing methods of the present disclosure.

The load applying unit applies a load to the light emitting elements mounted in the light emitting element mounting unit, i.e., performs a load application step in any of the manufacturing methods of the present disclosure. Any appropriate component may be employed for the load applying unit as long as it can apply a load to the light emitting elements. Examples of the load applying unit can include various presses.

The heating unit heats the resin layer, performing the first heating step and the second heating step in any of the manufacturing methods of the present disclosure described above. The heating unit can heat the resin layer while controlling the temperature. The heating unit described above can typically include various heaters, temperature sensors, and the like.

The control unit controls the load applying unit such that the load applied to the light emitting elements buries the semiconductor stack structures at least partly in the resin layer while exposing the second surfaces from the resin layer. Furthermore, the control unit controls the heating unit to heat the resin layer at a first temperature without applying the load to reduce the viscosity of the resin layer and subsequently heat the resin layer at a second temperature higher than the first temperature to harden in the state in which the second surfaces are exposed from the resin layer. The control unit preferably includes a data storage unit that stores data on the resins to be selected for the light emitting elements and the resin layers, the A-stage states of the resin layers, the embedded depth of the light emitting elements for the load application step, the first temperatures for the first heating step, and the second temperatures for the second heating step in correspondence with the types of light emitting devices to be manufactured. The control unit preferably includes a data processing unit that selects a embedded depth of light emitting elements in the load application step, a first temperature in the first heating step, and a second temperature in the second heating step by browsing the data stored in the data storage unit. The control unit preferably includes a data transmission unit that transmits the selected data to the light emitting element mounting unit, the load applying unit, and the heating unit.

The manufacturing device described above can include a cutting unit that cuts a substrate block that includes the light emitting devices obtained after the heating process performed by the heating unit into units each having a predetermined number of light emitting devices. Any appropriate unit may be used for the cutting unit as long as it can cut resin members. Examples of the cutting unit include various dicers, laser cutters, and the like.

What is claimed is:

1. A method of manufacturing a light emitting device comprising a light emitting element, the light emitting element including a semiconductor stack structure having a first surface, a second surface opposite to the first surface, and lateral surfaces between the first surface and the second surface, and electrodes disposed on the second surface of the semiconductor stack structure, the lateral surfaces of the semiconductor stack structure being covered by a resin member, the method comprising:

a resin layer disposition step comprising disposing, on a support, a resin layer in an A-stage state;

a light emitting element mounting step comprising mounting a light emitting element on the resin layer such that the first surface faces the upper surface of the resin layer;

a load application step comprising applying a load to the light emitting element so as to embed the semiconductor stack structure at least partly in the resin layer while exposing the second surface from the resin layer;

a first heating step comprising heating the resin layer at a first temperature without applying the load to the light emitting element, to lower a viscosity of the resin layer; and a second heating step comprising heating the resin layer at a second temperature higher than the first temperature to harden the resin layer in a state in which the second surface is exposed from the resin layer, to form a resin member.

2. The method of manufacturing a light emitting device according to claim 1, wherein:

the light emitting element and a resin to be used for the resin layer are selected in accordance with the light emitting device to be manufactured; and an A-stage state of the resin layer in the resin layer disposition step, the first temperature in the first heating step, and the second temperature in the second heating step are set in accordance with the light emitting device to be manufactured.

3. The method of manufacturing a light emitting device according to claim 2, further comprising:

a database preparation step comprising preparing a database that stores, in correspondence with types of light emitting devices to be manufactured, data on resins available for the light emitting elements and the resin layers, A-stage states of the resins available for the resin layer for the resin layer disposition step, embedded depths of the light emitting elements for the load application step, first temperatures for the first heating step, and second temperatures for the second heating step; wherein:

the embedded depth of the light emitting element in the load application step, the first temperature in the first heating step, and the second temperature in the second heating step are set by browsing the database.

4. The method of manufacturing a light emitting device according to claim 1, wherein, in the first heating step, positions of the upper surface of the resin layer and the second surface of the semiconductor stack structure are adjusted.

5. The method of manufacturing a light emitting device according to claim 1, wherein:

in the load application step, a load is applied to the light emitting element, which is mounted such that the first surface and the upper surface of the resin layer face each other, so as to partly embed the semiconductor stack structure in the resin layer; and in the first heating step, the light emitting element is allowed to sink due to a self-weight of the light emitting element such that the second surface of the semiconductor stack structure is exposed from the resin layer.

6. The method of manufacturing a light emitting device according to claim 1, wherein, in the first heating step, a height of the raised portion created in the load application step is reduced so as to be lower than a height of the electrodes of the light emitting element.

7. The method of manufacturing a light emitting device according to claim 1, wherein the resin layer contains a phosphor.

8. The method of manufacturing a light emitting device according to claim 1, wherein a thickness of the resin layer is larger than a thickness of the semiconductor stack structure.

9. The method of manufacturing a light emitting device according to claim 1, wherein the resin layer disposition step comprises a step of forming a hardened first light reflecting layer on the support before forming a resin layer on the hardened first light reflecting layer.

10. The method of manufacturing a light emitting device according to claim 1, further comprising, subsequent to forming the resin member by hardening the resin layer, a step of forming a second light reflecting layer covering the second surface and lateral surfaces of the electrodes.

11. The method of manufacturing a light emitting device according to claim 1, wherein:

the semiconductor stack structure of the light emitting element includes a substrate and a semiconductor layer disposed on the substrate; and in the load application step, the light emitting element is embedded in the resin layer such that the lateral surfaces of the substrate are covered at least in part.

12. The method of manufacturing a light emitting device according to claim 1, wherein:

the semiconductor stack structure of the light emitting element comprises a substrate and a semiconductor layer disposed on the substrate; and in the load application step, the light emitting element is embedded in the resin layer such that lateral surfaces of the substrate and portions of lateral surfaces of the semiconductor layer are covered.

13. A manufacturing device for manufacturing a light emitting device comprising a light emitting element, the light emitting element comprising a semiconductor stack having a first surface, a second surface opposite to the first surface, and lateral surfaces between the first surface and the second surface, and electrodes disposed on the second surface of the semiconductor stack structure, in which the lateral surfaces of the semiconductor stack structure are covered by a resin member, the device comprising:

a light emitting element mounting unit configured to place the light emitting element on the upper surface of a resin layer that is disposed on a support in an A-stage state, such that the first surface faces the resin layer;

a load applying unit configured to apply a load to the light emitting element;

a heating unit configured to heat the resin layer; and a control unit configured to:

control the load applying unit to apply a load to the light emitting element such that the semiconductor stack structure is embedded in the resin layer at least partly and the second surface is exposed from the resin layer, and control the heating unit to heat the resin layer at a first temperature in the absence of the load to reduce a viscosity of the resin layer, and subsequently heat the resin layer at a second temperature higher than the first temperature to harden the resin layer in a state in which the second surface is exposed from the resin layer.

* * * * *